(12) United States Patent
Sawaguchi et al.

(10) Patent No.: US 10,431,793 B2
(45) Date of Patent: Oct. 1, 2019

(54) METHOD OF PRODUCING A SEPARATOR AND METHOD OF PRODUCING A MICROPOROUS MEMBRANE

(71) Applicant: Sony Corporation, Tokyo (JP)

(72) Inventors: Masahiro Sawaguchi, Fukushima (JP); Masashi Meguro, Miyagi (JP); Masaru Hiratsuka, Kanagawa (JP); Yoshiyuki Fuchigami, Tokyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 15/411,242

(22) Filed: Jan. 20, 2017

(65) Prior Publication Data

US 2017/0133649 A1    May 11, 2017

Related U.S. Application Data

(62) Division of application No. 12/953,018, filed on Nov. 23, 2010, now Pat. No. 10,297,804.

(30) Foreign Application Priority Data

Nov. 30, 2009  (JP) .................................. 2009-271632

(51) Int. Cl.
*H01M 2/16* (2006.01)
*H01M 2/14* (2006.01)
(Continued)

(52) U.S. Cl.
CPC ............ *H01M 2/145* (2013.01); *B82Y 30/00* (2013.01); *C23C 14/081* (2013.01); *C23C 14/083* (2013.01); *C23C 14/087* (2013.01); *C23C 14/32* (2013.01); *C23C 14/34* (2013.01); *C23C 16/403* (2013.01); *C23C 16/405* (2013.01); *C23C 16/408* (2013.01); *C23C 16/448* (2013.01); *C23C 16/505* (2013.01);
(Continued)

(58) Field of Classification Search
CPC . H01M 2/1646; H01M 2/1686; H01M 2/1653
See application file for complete search history.

(56) References Cited

U.S. PATENT DOCUMENTS

| | | | | |
|---|---|---|---|---|
| 5,362,582 A | * | 11/1994 | Chang | H01M 2/14 429/129 |
| 2008/0280424 A1 | * | 11/2008 | Yamazaki | H01L 27/1266 438/480 |
| 2009/0246614 A1 | * | 10/2009 | Kim | H01M 2/145 429/145 |

FOREIGN PATENT DOCUMENTS

| | | |
|---|---|---|
| JP | H10-241657 A | 9/1998 |
| JP | 2001-307708 A | 11/2001 |

(Continued)

OTHER PUBLICATIONS

Japanese Office Action dated Jun. 18, 2013 in corresponding Japanese application No. 2009-271632.

*Primary Examiner* — Ula C Ruddock
*Assistant Examiner* — Frank A Chernow
(74) *Attorney, Agent, or Firm* — K&L Gates LLP

(57) ABSTRACT

A method of producing a separator is provided. The method includes providing a particle membrane including inorganic particles on at least one principal surface of a porous body by a vapor-phase process such that the particle membrane has a porosity that is non-uniform in a thickness direction thereof. A method of producing a microporous membrane is also provided.

20 Claims, 8 Drawing Sheets

(51) Int. Cl.
  *B82Y 30/00* (2011.01)
  *C23C 14/08* (2006.01)
  *C23C 14/32* (2006.01)
  *C23C 14/34* (2006.01)
  *C23C 16/40* (2006.01)
  *C23C 16/448* (2006.01)
  *C23C 16/505* (2006.01)

(52) U.S. Cl.
  CPC ....... *H01M 2/1646* (2013.01); *H01M 2/1653* (2013.01); *H01M 2/1686* (2013.01)

(56) References Cited

FOREIGN PATENT DOCUMENTS

| | | | |
|---|---|---|---|
| JP | 2001-319634 A | 11/2001 | |
| JP | 3253632 B2 | 2/2002 | |
| JP | 2004-014127 A | 1/2004 | |
| JP | 2005-196999 A | 7/2005 | |
| JP | 3771314 B2 | 4/2006 | |
| JP | 3797729 B2 | 7/2006 | |
| JP | 2009-518809 A | 5/2009 | |
| JP | 2011-503828 A | 1/2011 | |
| WO | 2009/066916 A2 | 5/2009 | |
| WO | WO-2009066916 * | 5/2009 | ............. H01M 2/16 |

* cited by examiner

METHOD OF PRODUCING A SEPARATOR AND METHOD OF PRODUCING A MICROPOROUS MEMBRANE

CROSS-REFERENCE TO RELATED APPLICATIONS

The present application is a divisional of U.S. application Ser. No. 12/953,018, filed Nov. 23, 2010, which claims priority to Japanese Application No. 2009-271632, filed Nov. 30, 2009, the disclosures of which are hereby incorporated by reference herein.

BACKGROUND

The present disclosure relates to a separator, a battery using the same, and a method for producing a separator, and also to a microporous membrane and a method for producing a microporous membrane. More specifically, it relates to a high-performance separator with excellent safety, a battery using the same, and a method for producing a separator, and also to a microporous membrane and a method for producing a microporous membrane.

With the recent progress in the technology of portable electronic devices, higher-performance mobile phones or notebook computers have been developed. In order to support such development, there is a need for excellent drive power supplies. Electronic devices are often required to operate for a long period of time, and they are also required to be lightweight and small. Accordingly, there is a demand for a power supply with high energy density. As a power supply that meets the demand, a lithium-ion secondary battery that achieves a high energy density has been widely used.

Such a lithium-ion secondary battery has extremely high energy density and uses a flammable organic solvent as the electrolytic solution, and, therefore, high safety is required. For this reason, various measures have been taken on lithium-ion secondary batteries so as to ensure safety even in the event of an abnormality.

For example, in order to provide double or triple protection against short-circuiting, a lithium-ion secondary battery is designed so that the current is stopped when a short circuit occurs therein, thereby ensuring safety. For example, in the case where an electrically conductive substance is mixed into the battery, whereby an internal short circuit occurs due to the formation of lithium dendrites, a safety circuit in the lithium-ion secondary battery performs the current cutoff function. In the case where the abnormal reaction is not terminated by the cutoff but is accelerated, and heat is thus abnormally generated, a porous membrane inside the battery melts to close the pores thereof. As a result, ion permeation is suppressed, thereby suppressing the abnormal reaction.

Such a lithium-ion secondary battery is expected to find wider applications in the fields of automobiles, home appliances, etc., and thus is required to have even higher safety, higher capacity, and a lighter weight and smaller size. In particular, assuming harsh conditions including crushing or like deformation due to possible external pressure upon loading on a movable body, puncture with a nail or like electrically conductive projection, etc., even more safety measures are required.

In order to meet such a demand for safety measures, a method for preventing a short circuit between the positive electrode and the negative electrode by covering the electrodes with an insulator has been proposed. Also, a technique to further improve the performance of a separator while maintaining the original performance has been proposed.

For example, JP-A-10-241657 (Patent Document 1) and Japanese Patent No. 3253632 (Patent Document 2) propose a technique in which an insulating material particle aggregate layer made of insulating material particles is placed between a positive electrode and a negative electrode. JP-A-2001-319634 (Patent Document 3) proposes a technique in which a ceramic complex layer including a matrix material, such as polyvinylidene fluoride, and inorganic particles is disposed on polyethylene. In addition, a separator (Celgard) formed by laminating polyethylene and polypropylene is commercially available.

These techniques are some examples of techniques to improve heat resistance, which has been a problem in known separators formed solely of a polymer film such as a polyolefin film. That is, in the case where pores are closed to suppress ion permeation, but heat generation cannot be suppressed and the temperature rises, because a separator made of a polyolefine has poor heat resistance, this may cause a meltdown of the separator, resulting in an internal short circuit. According to these techniques, even when a separator substrate undergoes a meltdown, an internal short circuit can be suppressed.

However, according to these techniques, an electrode is provided with a short-circuit prevention layer, while a separator is provided with a functional layer made of inorganic or organic components. As a result, the electrodes and the separator have an increased thickness, and this is disadvantageous in improving capacity. In particular, the formation of a functional layer has the problems of difficulty in selecting the material and complexity of the process.

In order to solve these problems, the following patent documents propose techniques to cover a separator with a thin inorganic membrane.

That is, JP-A-2004-14127 (Patent Document 4) proposes a technique to form an inorganic oxide porous membrane on an organic porous film by the sol-gel method. Japanese Patent No. 3771314 (Patent Document 5) describes a separator including a polyolefine porous film and an inorganic thin film formed on the cavity surface of the polyolefine porous film, the cavity surface having been subjected to an easy-adhesion treatment. Japanese Patent No. 3797729 (Patent Document 6) proposes a technique to cover a plastic film having poor heat resistance with a ceramic made of a $SiO_2$ membrane.

According to the techniques of these three patent documents, a silicon organic compound or the like is applied, and the organic substances are removed to form an inorganic membrane. However, these techniques are problematic in that application and drying are necessary, making it difficult to form an inorganic membrane at low cost.

In order so solve these problems, JP-A-2005-196999 (Patent Document 7) proposes a technique to form an inorganic membrane on the surface of a separator substrate by deposition and sputtering. This technique is advantageous in that an inorganic membrane can be easily formed.

SUMMARY

However, according to the technique of Patent Document 7 mentioned above, it is difficult to properly control the distribution of voids in the thickness direction of the inorganic membrane. There thus is a problem that it is difficult to control the adhesion between the inorganic membrane and the separator substrate and the heat resistance of the separator substrate.

In addition, because the inorganic membrane is thin relative to the size of deposition particles, it is difficult to completely cover the surface of the separator substrate with the inorganic membrane. Accordingly, the surface of the separator substrate may be exposed in some parts, that is, for example, the inorganic membrane may be formed in the form of islands, in which case the advantages of the inorganic membrane will not be sufficiently obtained. That is, in such a case, although the inorganic membrane can be expected to provide heat resistance as a spacer between electrodes, the network of deposition particles does not have much reinforcing effects, and cracks and like phenomena are likely to occur. In addition, there is a problem that the deposition particles may escape from the separator.

Therefore, it is desirable to provide a separator whose strength can be improved while maintaining ion permeability by properly controlling the distribution of voids in the thickness direction of an inorganic membrane; a battery using the same; a method for producing of a separator; a microporous membrane; and a method for producing a microporous membrane.

According to an embodiment, there is provided a separator including a porous body and a particle membrane. The particle membrane is formed on at least one principal surface of the porous body, is made of inorganic particles, and has a void formed therein by the inorganic particles. The particle membrane has a porosity that is non-uniform in the thickness direction thereof.

According to another embodiment, there is provided a battery including a positive electrode, a negative electrode, and a separator. The separator includes a porous body and a particle membrane. The particle membrane is formed on at least one principal surface of the porous body, is made of inorganic particles, and has a void formed therein by the inorganic particles. The particle membrane has a porosity that is non-uniform in the thickness direction thereof.

According to another embodiment, there is provided a method for producing of a separator, including a particle-membrane-forming step of forming a particle membrane made of inorganic particles on at least one principal surface of a porous body. The particle-membrane-forming step includes forming a void by the inorganic particles in such a manner that the particle membrane has a porosity that is non-uniform in the thickness direction thereof.

According to another embodiment, there is provided a microporous membrane including a porous body and a particle membrane. The particle membrane is formed on at least one principal surface of the porous body, is made of inorganic particles, and has a void formed therein by the inorganic particles. The particle membrane has a porosity that is non-uniform in the thickness direction thereof.

According to another embodiment, there is provided a method for producing a microporous membrane, including a particle-membrane-forming step of forming a particle membrane made of inorganic particles on at least one principal surface of a porous body. The particle-membrane-forming step includes forming a void by the inorganic particles in such a manner that the particle membrane has a porosity that is non-uniform in the thickness direction thereof.

In the above embodiments, a particle membrane, which is made of inorganic particles and has a void formed therein by the inorganic particles, is formed on at least one principal surface of a porous body. The particle membrane has a porosity controlled to be non-uniform in the thickness direction of the particle membrane. As a result, an improvement in strength can be achieved while maintaining ion permeability.

According to the embodiments, an improvement in strength can be achieved while maintaining ion permeability.

Additional features and advantages are described herein, and will be apparent from the following Detailed Description and the figures.

BRIEF DESCRIPTION OF THE FIGURES

FIG. 15 is a schematic diagram for explaining a short circuit test.

DETAILED DESCRIPTION

Embodiments will be described hereinafter with reference to the drawings. The description will be given in the following order.

1. First Embodiment (Microporous membrane)
2. Second Embodiment (First example of a nonaqueous electrolyte battery)
3. Third Embodiment (Second example of a nonaqueous electrolyte battery)
4. Fourth Embodiment (Third example of a nonaqueous electrolyte battery)
5. Other Embodiments (Variations)

1. First Embodiment

Figure 1:
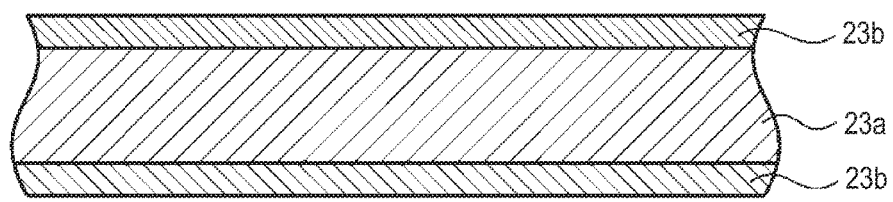
FIG. 1 is a cross-sectional view showing the configuration of a microporous membrane according to a first embodiment.

A microporous membrane according to a first embodiment will be described with reference to drawings. FIG. 1 is a cross-sectional view showing the configuration of the microporous membrane according to the first embodiment. As shown in FIG. 1, the microporous membrane includes a substrate 23a having a first principal surface and a second principal surface, and also includes an inorganic particle membrane 23b formed on at least one of the principal surfaces of the substrate 23a. FIG. 1 shows an example in which the inorganic particle membrane 23b is formed on each principal surface of the substrate 23a.

(Substrate)

As the substrate 23a, an organic polymer porous body or the like may be used. Examples of organic polymer porous bodies include polyolefine-based porous membranes, such as polyethylene-based porous membranes and polypropylene-based porous membranes, polyester-based porous membranes, polyimide-based porous membranes, and polyamide-based porous membranes. The substrate 23a may also be made of a mixture of several kinds of materials. The substrate 23a may also be formed of a stack of multiple layers of organic polymer porous bodies. In order to increase the bond strength of the inorganic particle membrane 23b, the substrate 23a may have been subjected to a surface treatment, such as washing with acid or alkali, washing with ion water or a like functional water, a treatment with ozone or a like gas or with a high energy beam, etc.

(Inorganic Particle Membrane)

Figure 2:
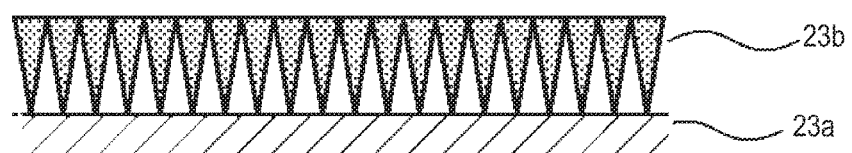
FIG. 2 is a cross-sectional view showing the configuration of an inorganic particle membrane.

FIG. 2 schematically shows a cross section of the inorganic particle membrane 23b. The inorganic particle membrane 23b is a thin film formed by the deposition of an inorganic material. The inorganic particle membrane 23b is formed by the accumulation of inorganic particles. The inorganic particle membrane 23b is configured such that the density of the accumulated inorganic particles is non-uniform in the thickness direction thereof. More specifically, the density of inorganic particles is set so that, in the thickness direction of the inorganic particle membrane 23b, it is highest near the outer surface of the inorganic particle membrane 23b. The density of inorganic particles is set so that, in the thickness direction of the inorganic particle membrane 23b, it is lowest near the membrane/substrate interface. The density of inorganic particles is also set so that it gradually decreases from the outer surface of the inorganic particle membrane 23b to the membrane/substrate interface.

As a result, voids formed in the inorganic particle membrane 23b by the inorganic particles are non-uniform in the thickness direction. That is, the porosity of the inorganic particle membrane 23b is non-uniform in the thickness direction. More specifically, in the thickness direction of the inorganic particle membrane 23b, the porosity is lowest near the outer surface of the inorganic particle membrane 23b, while it is highest near the membrane/substrate interface. The porosity gradually increases from the outer surface of the inorganic particle membrane 23b to the membrane/substrate interface.

When the density of inorganic particles is non-uniform in the thickness direction of the inorganic particle membrane 23b, this allows for an improvement in strength while maintaining ion permeability. That is, in the thickness direction of the inorganic particle membrane 23b, a region with a high density of inorganic particles (region with low porosity) ensures strength, while a region with a low density of inorganic particles (region with high porosity) maintains ion permeability. In order to ensure strength, it is preferable that the region with a high density of inorganic particles is about 10 nm or more in the thickness direction. The region is more preferably 50 nm or more, and particularly preferably 100 nm or more and 1000 nm or less. When the region is more than 1000 nm, ion permeability or flexibility may be adversely affected. In addition, this is also disadvantageous in terms of battery capacity. The region with a high density of inorganic particles is defined as a region where the density is about 50% or more. The region with a low density of inorganic particles is preferably 10 nm or more in the thickness direction. When minimum strength is ensured, the porosity is preferably as low as possible so that fewer regions interfere with ion permeation. The region with a low density of inorganic particles is defined as a region where the density is about 40% or less.

As a material for the inorganic particle membrane 23b, an inorganic material that can be formed into particulates and has high insulating properties is usable. As such inorganic materials, metal oxides, metal carbides, metal sulfides, metal carbonates, metal sulfates, metal phosphates, and the like are usable. More specifically, oxides, carbides, sulfides, carbonates, sulfates, and phosphates of aluminum, titanium, cerium, zirconia, magnesium, chromium, calcium, tin, indium, and germanium are usable, for example. Of these, oxides of aluminum and oxides of titanium are preferable. The inorganic particle membrane 23b may be made of a single kind of inorganic material or may also be made of two or more kinds of inorganic materials. The physical properties of the inorganic particle membrane 23b other than electrical resistance may vary within the membrane. For example, the inorganic particle membrane 23b may have a non-uniform composition, different crystal structures, etc.

(Size of Inorganic Particles)

The size of the inorganic particles that form the inorganic particle membrane 23b can be suitably adjusted. In order to perform functions of the embodiments, in terms of ion permeation, it is preferable that small primary particles are bound together into aggregates (tufts), resulting in greater denseness/sparseness to form voids. Specifically, it is preferable to make an adjustment so that the inorganic particles have a secondary particle diameter of 20 nm or less. Preferably, 50% or more of the inorganic particles have a secondary particle diameter of 20 nm or less as a whole. When more than 50% of the particles have a secondary particle diameter of more than 20 nm, the inorganic particles have a reduced number of contact points with one another, causing a decrease in the adhesion with the substrate 23a. In addition, it becomes difficult to retain the shape the inorganic particle membrane 23b.

(Oxidation Degree of Inorganic Particles)

The oxidation degree may be non-uniform in the thickness direction of the inorganic particle membrane 23b. For example, the oxidation degree may be set so that, in the thickness direction of the inorganic particle membrane 23b, it is highest near the outer surface of the inorganic particle membrane 23b, while it is lowest near the membrane/substrate interface. In this case, the oxidation degree may also be set so that it gradually decreases, in the thickness direction of the inorganic particle membrane 23b, from the outer surface of the inorganic particle membrane 23b to the membrane/substrate interface. Alternatively, for example, the oxidation degree may also be set so that, in the thickness direction of the inorganic particle membrane 23b, it is lowest near the outer surface of the inorganic particle membrane 23b, while it is highest near the membrane/substrate interface. In this case, the oxidation degree may also be set so that it gradually increases, in the thickness direction of the inorganic particle membrane 23b, from the outer surface of the inorganic particle membrane 23b to the membrane/substrate interface. Apart from the setting of voids, these operations to change the crystal structure make it possible to provide the inorganic membrane with suitable strength and density.

(Thickness of Inorganic Particle Membrane)

The thickness of the inorganic particle membrane 23b can be suitably adjusted. In order to obtain enhanced heat resistance, the inorganic particle membrane 23b is preferably thick. However, in terms of ion permeability and productivity, the thickness is preferably 1 μm or less. Meanwhile, in order to enable the stacking of primary particles and form voids in the inorganic particle membrane 23b in such a manner that they are non-uniform in the thickness direction, it is necessary that the thickness of the inorganic particle membrane 23b is 10 nm or more.

(Method for Producing Microporous Membrane)

(Substrate)

The substrate 23a can be formed, for example, by a drawing pore-forming process, a phase separation process, or the like. For example, in a drawing pore-forming process, first, a molten polymer is extruded from a T-die or a circular die and then heat-treated to form a highly ordered crystal structure. Subsequently, cold drawing is performed, followed by hot drawing, thereby separating the crystal interfaces and creating spaces between lamellae to form a porous structure. In a phase separation process, a homogeneous solution prepared by mixing a polymer with a solvent at a high temperature is formed into a film by a T-die process, an inflation process, etc., and then the solvent is extracted with another volatile solvent, whereby a microporous substrate can be obtained. Methods for producing a substrate are not limited to these, and a wide variety of heretofore proposed methods are usable. It is also possible to directly use an available porous film, such as a commercially available porous film.

(Formation of Inorganic Particle Membrane)

The inorganic particle membrane 23b is formed on the substrate 23a. The inorganic particle membrane 23b can be formed by a vapor-phase process, such as a PVD (Physical Vapor Deposition) process or a CVD (Chemical Vapor Deposition) process, for example. A wet coating technique is also applicable to form the inorganic particle membrane 23b.

A PVD process is a method in which a raw material for a thin film is first evaporated/vaporized by energy such as heat or plasma, and then applied onto the substrate to form a thin film. Examples of PVD processes include vacuum deposition, sputtering, ion plating, MBE (Molecular Beam Epitaxy), and laser ablation.

A CVD process is a method in which energy such as heat, light, or plasma is applied to a material for a thin film which is supplied in the form of a gas, thereby forming a decomposition/reaction/intermediate product of material gas molecules, and the formed product is deposited as a thin film through adsorption, reaction, and desorption on the substrate surface.

Examples of CVD processes include thermal CVD, MOCVD (Metal Organic Chemical Vapor Deposition), RF plasma CVD, optical CVD, laser CVD, and LPE (Liquid Phase Epitaxy).

The density of inorganic particles in the thickness direction of the inorganic particle membrane 23b can be controlled in various ways, such as by suitably selecting the deposition conditions. For example, in vacuum deposition, the density can be controlled by suitably adjusting the angle of incidence of deposition particles on the substrate 23a on which the particles are deposited. The deposition particles can be densely accumulated by deposition from a direction perpendicular to the substrate 23a, while the deposition particles can be sparsely accumulated by deposition from an oblique direction inclined to the direction perpendicular to the substrate 23a. In this way, the density variation in the thickness direction of the inorganic particle membrane 23b can be controlled.

The variation in the density of inorganic particles in the thickness direction may also be controlled by deposition using several kinds of inorganic particles in such a manner that the kinds of inorganic materials vary in the thickness direction. That is, due to the difference in melting point among the kinds of materials, the particle diameters of the deposited inorganic particles naturally vary; this can be utilized to control the density variation in the thickness direction.

Figure 3:
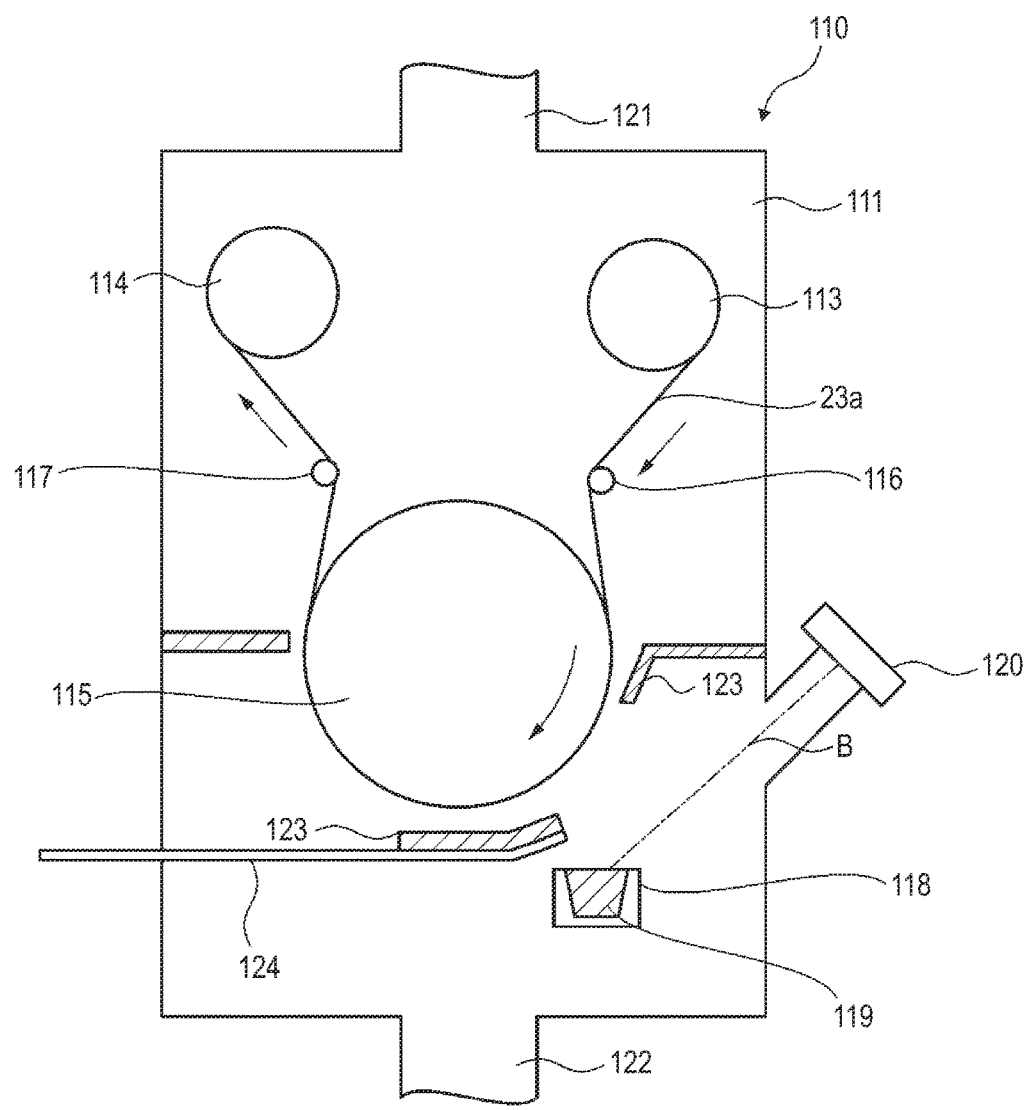
FIG. 3 is a schematic diagram showing an example of a deposition apparatus for use in the formation of an inorganic particle membrane.

As an example, the following more specifically describes the formation of the inorganic particle membrane 23b by vacuum deposition. FIG. 3 is a schematic diagram of a deposition apparatus for use in the formation of the inorganic particle membrane 23b. The deposition apparatus 110 includes a vacuum chamber 111 evacuated through an exhaust port 121 and an exhaust port 122, and also includes a feed roll 113 and a take-up roll 114 disposed in the vacuum chamber 111. In the vacuum chamber 111, the substrate 23a travels sequentially between the feed roll 113 and the take-up roll 114.

A cooling can 115 is disposed on the way between the feed roll 113 and the take-up rolls 114, where the substrate 23a travels. The cooling can 115 includes a cooling apparatus for suppressing thermal deformation due to a rise in the temperature of the substrate 23a traveling on the peripheral surface thereof, for example.

The substrate 23a is sequentially fed from the feed roll 113, passes through the peripheral surface of the cooling can 115, and is wound up by the take-up roll 114. Guide rolls 116 and 117 apply a predetermined tension to the substrate 23a so that it travels smoothly.

In the vacuum chamber 111, a crucible 118 is disposed below the cooling can 115, and the crucible 18 is filled with a film-forming material 119 as a deposition source. A sidewall portion of the vacuum chamber 111 has an electron gun 120 for heating and evaporating the film-forming material 119 in the crucible 118. The electron gun 120 is placed in such a position that an electron beam B therefrom irradiates the film-forming material 119 in the crucible 118. The film-forming material 119 evaporated by irradiation with the electron beam B adheres to the surface of the substrate 23a to form an inorganic particle membrane 23b.

In a position between the cooling can 115 and the crucible 118 and near the cooling can 115, a shutter 123 is placed to cover a predetermined region of the substrate 23a that travels on the peripheral surface of the cooling can 115. The shutter 123 provides control so that, relative to the substrate 23a, the evaporated film-forming material 119 is obliquely deposited at an incidence angle within a predetermined range.

Further, an oxygen gas introduction pipe 124 is disposed through a sidewall portion of the vacuum chamber 111 so that oxygen gas is supplied to the surface of the substrate 23a during the deposition of the inorganic particle membrane 23b, thereby controlling the oxidation degree, the particle diameter, and the like of the inorganic particulate membrane 23b. In this embodiment, for example, an adjustment is made so that 50% or more of the inorganic particles forming the inorganic particle membrane 23b have a second particle diameter of several nanometers to 20 nm.

The cooling can 115 is rotated in the direction towards the crucible 118, and the film-forming material 119 is deposited onto the substrate 23a that travels with the rotation. As a result, with respect to the substrate 23a, the film-forming material 119 is deposited first from an oblique direction and then gradually from the perpendicular direction. Accordingly, an inorganic particle membrane 23b in which voids gradually decrease from the membrane/substrate interface to the outer surface thereof can be obtained. That is, in the deposition onto the substrate 23a, first, the angle of the formation of particulates changes with the travel of the substrate 23a. In the deposition start position distant from the crucible 118 that is a deposition source, particulates are formed at an angle of about 45° with respect to the substrate 23a, for example. As the substrate 23a travels closer to the crucible 118, particulates are formed at an angle that gradually approaches the vertical. This is accompanied by a decrease in the adhesion area per unit of the deposition metal, whereby the concentration of particulates also increases. Accordingly, the density in the inorganic particle membrane 23b can be gradually increased. The cooling can 115 may also be rotated in the opposite direction to switch the substrate 23a feed side and take-up side, thereby forming a membrane in which the concentration of inorganic particles gradually decreases. The inorganic particle membrane 23b is thus formed.

(Variations)

The density distribution in the thickness direction of the inorganic particle membrane 23b is not limited to the above example, and can be suitably controlled in different modes. Some variations will be described hereinafter, varying the density distributions in the thickness direction of the inorganic particle membrane 23b.

Figure 4A:
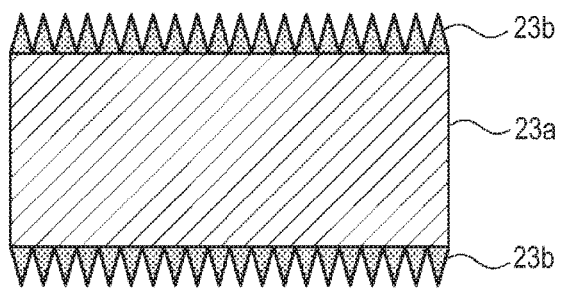
FIGS. 4A to 4D are cross-sectional views showing examples of the configuration of an inorganic particle membrane.

FIG. 4A shows a first variation of a microporous membrane. In this microporous membrane, an inorganic particle membrane 23b is formed on each principal surface of a substrate 23a. In the microporous membrane, the density of inorganic particles is set so that, in the thickness direction of the inorganic particle membrane 23b, it is lowest near the outer surface of the inorganic particle membrane 23b, while it is highest near the membrane/substrate interface. Further, the density is also set so that it gradually increases, in the thickness direction of the inorganic particle membrane 23b, from the outer surface of the inorganic particle membrane 23b to the membrane/substrate interface. Accordingly, the inorganic particle membrane 23b has voids that gradually increase in size, in the thickness direction, from the membrane/substrate interface to the outer surface thereof.

Figure 4B:
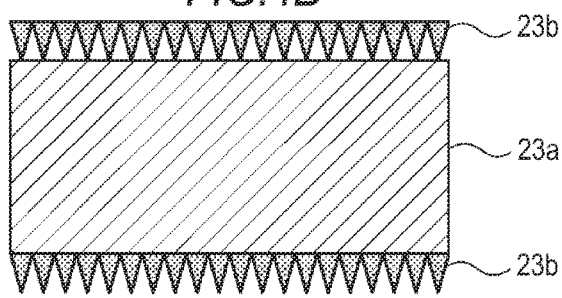

FIG. 4B shows a second variation of a microporous membrane. In this microporous membrane, an inorganic particle membrane 23b is formed on each principal surface of a substrate 23a. The microporous membrane is configured such that the distribution of the density of inorganic particles in the thickness direction on the first principal surface of the substrate 23a is different from the distribution of the density of inorganic particles in the thickness direction on the second principal surface. In the inorganic particle membrane 23b on the first principal surface, the density of inorganic particles is set so that, in the thickness direction, it is highest near the outer surface of the inorganic particle membrane 23b, while it is lowest near the membrane/substrate interface. Further, the density of inorganic particles is also set so that it gradually decreases, in the thickness direction, from the outer surface of the inorganic particle membrane 23b to the membrane/substrate interface. Accordingly, the inorganic particle membrane 23b on the first principle surface has voids that gradually decrease in size, in the thickness direction, from the membrane/substrate interface to the outer surface thereof.

In the inorganic particle membrane 23b on the second principal surface, the density of inorganic particles is set so that, in the thickness direction, it is lowest near the outer surface of the inorganic particle membrane 23b, while it is highest near the membrane/substrate interface. Further, the density of inorganic particles is also set so that it gradually increases, in the thickness direction, from the outer surface of the inorganic particle membrane 23b to the membrane/substrate interface. Accordingly, the inorganic particle membrane 23b on the second principle surface has voids that gradually increase in size, in the thickness direction, from the membrane/substrate interface to the outer surface thereof.

Figure 4C:
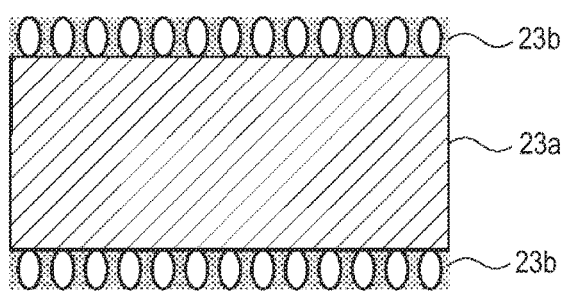

FIG. 4C shows a third variation of a microporous membrane. In this microporous membrane, an inorganic particle membrane 23b is formed on each principal surface of a substrate 23a. In the microporous membrane, the density of inorganic particles is set so that, in the thickness direction of the inorganic particle membrane 23b, it is highest near the outer surface of the inorganic particle membrane 23b and also near the membrane/substrate interface, while it is lowest near the midpoint between the outer surface of the inorganic particle membrane 23b and the membrane/substrate interface. Accordingly, in the thickness direction, the inorganic particle membrane 23b has voids that are smallest near the outer surface thereof and the membrane/substrate interface and largest near the midpoint between the outer surface thereof and the substrate 23a.

Figure 4D:
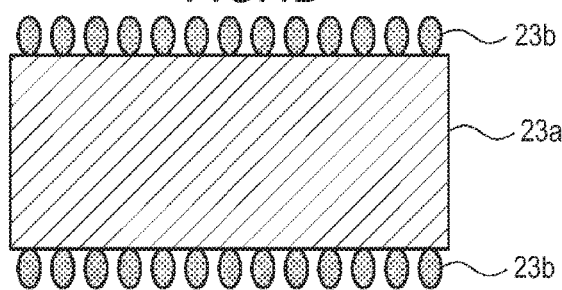

FIG. 4D shows a fourth variation of a microporous membrane. In this microporous membrane, an inorganic particle membrane 23b is formed on each principal surface of a substrate 23a. In the microporous membrane, the density of inorganic particles is set so that, in the thickness direction of the inorganic particle membrane 23b, it is lowest near the outer surface of the inorganic particle membrane 23b and also near the membrane/substrate interface, while it is highest near the midpoint between the outer surface of the inorganic particle membrane 23b and the membrane/substrate interface. Accordingly, in the thickness direction, the inorganic particle membrane 23b has voids that are largest near the outer surface thereof and the membrane/substrate interface and smallest near the midpoint between the outer surface thereof and the substrate 23a.

Figure 5A:
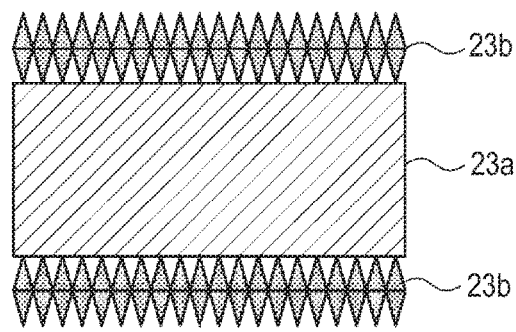
FIGS. 5A to 5D are cross-sectional views showing examples of the configuration of an inorganic particle membrane.

FIG. 5A shows a fifth variation of the microporous membrane. In this microporous membrane, an inorganic particle membrane 23b is formed on each principal surface of a substrate 23a. In the microporous membrane, the inorganic particle membrane 23b includes a first layer formed on the substrate 23a and a second layer formed on the first layer. In the first layer, the density of inorganic particles is set so that, in the thickness direction, it is lowest near the membrane/substrate interface, while it is highest near the first layer/second layer interface. The density of inorganic particles is also set so that it gradually increases from the membrane/substrate interface to the first layer/second layer interface. Accordingly, the first layer has voids that gradually decrease in size, in the thickness direction, from the membrane/substrate interface to the first layer/second layer interface. In the second layer, the density of inorganic particles is set so that, in the thickness direction, it is highest near the first layer/second layer interface, while it is lowest near the outer surface of the inorganic particle membrane 23b. Accordingly, the second layer has voids that increase in size, in the thickness direction, from the first layer/second layer interface to the outer surface of the inorganic particle membrane 23b.

Figure 5B:
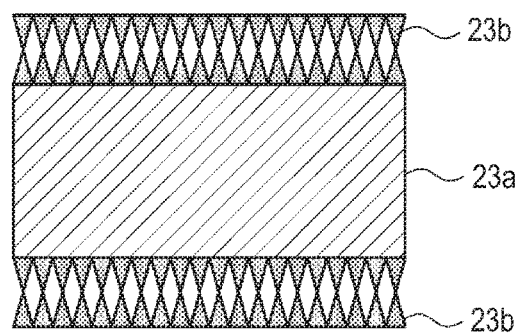

FIG. 5B shows a sixth variation of a microporous membrane. In this microporous membrane, an inorganic particle membrane 23b is formed on each principal surface of a substrate 23a. In the microporous membrane, the inorganic particle membrane 23b includes a first layer formed on the substrate 23a and a second layer formed on the first layer. In the first layer, the density of inorganic particles is set so that, in the thickness direction, it is highest near the membrane/substrate interface, while it is lowest near the first layer/second layer interface. The density of inorganic particles is also set so that it gradually decreases from the membrane/substrate interface to the first layer/second layer interface. Accordingly, the first layer has voids that gradually increase in size, in the thickness direction, from the membrane/substrate interface to the first layer/second layer interface. In the second layer, the density of inorganic particles is set so that, in the thickness direction, it is lowest near the first layer/second layer interface, while it is highest near the outer surface of the inorganic particle membrane 23b. Accordingly, the second layer has voids that decrease in size, in the thickness direction, from the first layer/second layer interface to the outer surface of the inorganic particle membrane 23b.

Figure 5C:
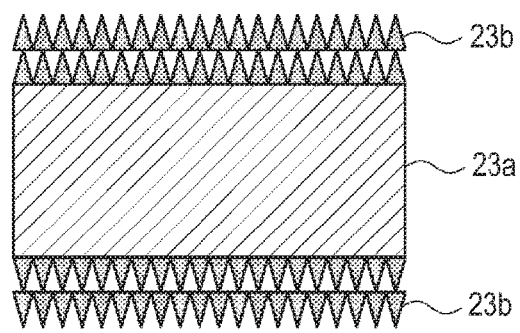

FIG. 5C shows a seventh variation of a microporous membrane. In this microporous membrane, an inorganic particle membrane 23b is formed on each principal surface of a substrate 23a. In the microporous membrane, the inorganic particle membrane 23b includes a first layer formed on the substrate 23a and a second layer formed on the first layer. In the first layer, the density of inorganic particles is set so that, in the thickness direction, it is highest near the membrane/substrate interface, while it is lowest near the first layer/second layer interface. The density of inorganic particles is also set so that it gradually decreases from the membrane/substrate interface to the first layer/second layer interface. Accordingly, the first layer has voids that gradually increase in size, in the thickness direction, from the membrane/substrate interface to the first layer/second layer interface. In the second layer, the density of inorganic particles is set so that, in the thickness direction, it is highest near the first layer/second layer interface, while it is lowest near the outer surface of the inorganic particle membrane 23b. Accordingly, the second layer has voids that increase in size, in the thickness direction, from the first layer/second layer interface to the outer surface of the inorganic particle membrane 23b.

Figure 5D:
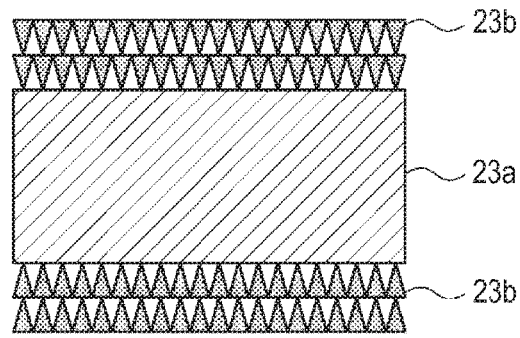

FIG. 5D shows an eighth variation of a microporous membrane. In this microporous membrane, an inorganic particle membrane 23b is formed on each principal surface of a substrate 23a. In the microporous membrane, the inorganic particle membrane 23b includes a first layer formed on the substrate 23a and a second layer formed on the first layer. In the first layer, the density of inorganic particles is set so that, in the thickness direction, it is lowest near the membrane/substrate interface, while it is highest near the first layer/second layer interface. The density of inorganic particles is also set so that it gradually increases from the membrane/substrate interface to the first layer/second layer interface. Accordingly, the first layer has voids that gradually decrease in size, in the thickness direction, from the membrane/substrate interface to the first layer/second layer interface. In the second layer, the density of inorganic particles is set so that, in the thickness direction, it is lowest near the first layer/second layer interface, while it is highest near the outer surface of the inorganic particle membrane 23b. Accordingly, the second layer has voids that decrease in size, in the thickness direction, from the first layer/second layer interface to the outer surface of the inorganic particle membrane 23b.

<Effect>

In the first embodiment, the density of inorganic particles is non-uniform in the thickness direction of the inorganic particle membrane, whereby strength can be improved while maintaining ion permeability. That is, in the thickness direction of the inorganic particle membrane, a region with a high density of inorganic particles ensures strength, while a region with a low density of inorganic particles maintains ion permeability.

2. Second Embodiment

A nonaqueous electrolyte battery according to a second embodiment will be described. In the nonaqueous electrolyte according to the second embodiment, the microporous membrane according to the first embodiment is used as a separator.

(Configuration of Battery)

Figure 6:
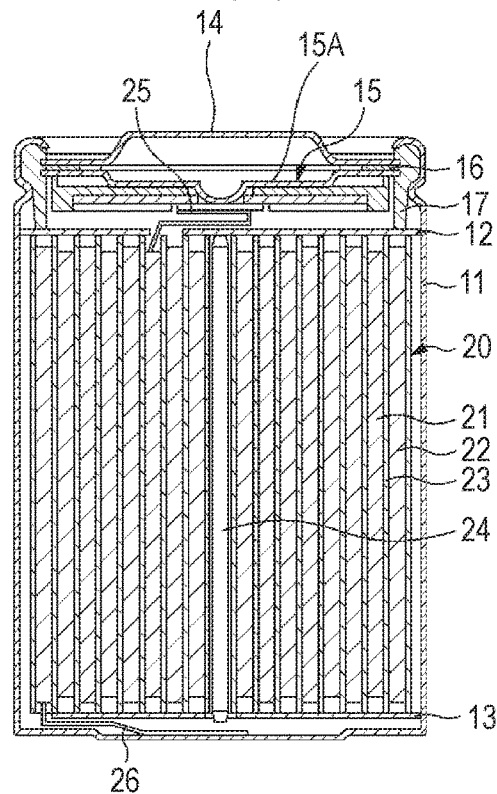
FIG. 6 is a cross-sectional view showing the configuration of a nonaqueous electrolyte battery according to a second embodiment.

FIG. 6 is a cross-sectional view showing an example of the configuration of the nonaqueous electrolyte battery according to the second embodiment. This nonaqueous electrolyte battery is a lithium-ion secondary battery, in which at the time of charging, lithium ions are deintercalated from the positive electrode and, through the electrolytic solution, intercalated into the negative electrode, while at the time of discharging, lithium ions are deintercalated from the negative electrode and, through the electrolytic solution, intercalated into the positive electrode. The nonaqueous electrolyte battery has a so-called cylindrical structure.

As shown in FIG. 6, the nonaqueous electrolyte battery includes an wound electrode assembly 20 obtained by winding a pair of a strip-like positive electrode 21 and a strip-like negative electrode 22 laminated via a separator 23, which is housed in a cylindrical battery can 11. The battery can 11 is made of iron (Fe) plated with nickel (Ni), and one end thereof is closed, while the other end is open. The battery can 11 is filled with an electrolytic solution, and the separator 23 is impregnated with the electrolytic solution. A pair of insulating plates 12 and 13 are arranged perpendicularly to the peripheral winding surface in such a manner that the wound electrode assembly 20 is sandwiched therebetween.

The open end of the battery can 11 has attached thereto, by caulking via a sealing gasket 17, a battery cover 14, a safety valve mechanism 15, and a PTC (Positive Temperature Coefficient) device 16. The valve mechanism 15 and the PTC device 16 are disposed on the inside of the battery cover 14. The interior of the battery can 11 is thus hermetically sealed. The battery cover 14 is made of the same material as the battery can 11, for example. The safety valve mechanism 15 is electrically connected to the battery cover 14, and is configured such that when the internal pressure of the battery reaches a certain level or higher due to an internal short circuit, external heating, or the like, a disk plate 15A is turned over to cut the electrical connection between the battery cover 14 and the wound electrode assembly 20. The sealing gasket 17 is made of an insulating material, and the surface thereof is coated with asphalt, for example.

A center pin 24 is inserted in the center of the wound electrode assembly 20. A positive electrode lead 25 made of aluminum (Al) or the like is connected to the positive electrode 21 of the wound electrode assembly 20, and a negative electrode lead 26 made of nickel or the like is connected to the negative electrode 22. The positive electrode lead 25 is welded to the safety valve mechanism 15 and is thereby electrically connected to the battery cover 14. The negative electrode lead 26 is welded and electrically connected to the battery can 11.

(Positive Electrode)

Figure 7:
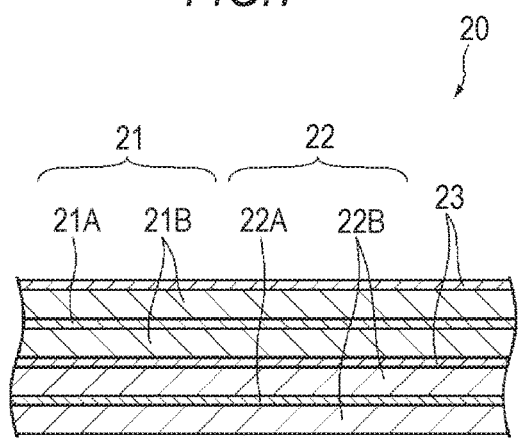
FIG. 7 is an enlarged cross-sectional view of a wound electrode assembly.

FIG. 7 is an enlarged cross-sectional view of a part of the wound electrode assembly 20 shown in FIG. 6. The positive electrode 21 includes a positive electrode collector 21A having a pair of surfaces, and also includes a positive electrode active material layer 21B formed on each surface of the positive electrode collector 21A, for example. The positive electrode active material layer 21B may also be formed only on one surface of the positive electrode collector 21A.

The positive electrode collector 21A is made of a metal material such as aluminum, nickel, or stainless steel, for example. The positive electrode collector 21A may be in the form of a foil, a mesh, a fibrous thin film, or the like.

The positive electrode active material layer 21B contains, as a positive electrode active material, at least one kind of positive electrode material capable of intercalating and deintercalating lithium. The positive electrode active material layer 21B may also contain other materials as required, such as a positive electrode binder and a positive electrode conductive agent.

A preferred example of a positive electrode material capable of intercalating and deintercalating lithium is a lithium-containing compound. This is because a high energy density can be obtained. Examples of lithium-containing compounds are complex oxides containing lithium and a transition metal element, phosphate compounds containing lithium and a transition metal element, and so forth. Of these, those containing as a transition metal element at least one kind selected from the group consisting of cobalt, nickel, manganese, and iron are preferable. This is because a higher voltage can be obtained. Such a compound is represented by a chemical formula $Li_xM1O_2$ or $Li_yM2PO_4$, for example. In the formulae, M1 and M2 each represent at least one kind of transition metal element. The values of x and y vary depending on the state of charge or discharge, and usually $0.05 \leq x \leq 1.10$ and $0.05 \leq y \leq 1.10$.

Examples of complex oxides containing lithium and a transition metal element include a lithium cobalt complex oxide ($Li_xCoO_2$), a lithium nickel complex oxide ($Li_xNiO_2$), a lithium nickel cobalt complex oxide ($Li_xNi_{1-z}Co_zO_2$ (z<1)), a lithium nickel cobalt manganese complex oxide ($Li_xNi_{(1-v-w)}Co_vMn_wO_2$ (v+w<1)), and a lithium manganese complex oxide ($LiMn_2O_4$) with a spinel structure. Of these, complex oxides containing cobalt are preferable. This is because high capacity together with excellent cycle characteristics can be obtained. Examples of phosphate compounds containing lithium and a transition metal element include a lithium iron phosphate compound ($LiFePO_4$) and a lithium iron manganese phosphate compound ($LiFe_{1-u}Mn_uPO_4$ (u<1)).

Other examples of positive electrode materials capable of intercalating and deintercalating lithium include oxides such as titanium oxide, vanadium oxide, and manganese dioxide, disulfides such as titanium disulfide and molybdenum sulfide, and chalcogenides such as niobium selenide. Sulfur and electrically conductive polymers such as polyaniline and polythiophene can also be mentioned.

The positive electrode material capable of intercalating and deintercalating lithium may be other than those mentioned above. It is also possible to use a mixture of any combination of two or more kinds of the positive electrode materials mentioned above.

Examples of positive electrode binders include synthetic rubbers such as styrene-butadiene-based rubber, fluorine-based rubber, and ethylene propylene diene, as well as polymer materials such as polyvinylidene fluoride. They may be used alone or in combination.

Examples of positive electrode conductive agents include carbon materials such as graphite, carbon black, acetylene black, and ketjen black. They may be used alone or in combination. In addition, as long as the material is electrically conductive, the positive electrode conductive agent may also be a metal material, an electrically conductive polymer, or the like.

(Negative Electrode)

The negative electrode 22 includes a negative electrode collector 22A having a pair of surfaces, and also includes a negative electrode active material layer 22B formed on each surface of the negative electrode collector 22A, for example. The negative electrode active material layer 22B may also be formed only on one surface of the negative electrode collector 22A.

The negative electrode collector 22A is made of a metal material such as copper, nickel, or stainless steel, for example. The negative electrode collector 22A may be in the form of a foil, a mesh, a fibrous thin film, or the like.

The negative electrode active material layer 22B contains, as a negative electrode active material, at least one kind of negative electrode material capable of intercalating and deintercalating lithium. The negative electrode active material layer 22B may also contain other materials as required, such as a negative electrode binder and a negative electrode conductive agent. In this case, it is preferable that the charge capacity of the negative electrode material capable of intercalating and deintercalating lithium is higher than the discharge capacity of the positive electrode. The details of negative electrode binders and negative electrode conductive agents are the same as of positive electrode binders and positive electrode conductive agents, respectively, for example.

Examples of negative electrode materials capable of intercalating and deintercalating lithium include carbon materials. Examples of such carbon materials include graphitizable carbon, non-graphitizable carbon having a (002) plane spacing of 0.37 nm or more, and graphite having a (002) plane spacing of 0.34 nm or less. More specifically, examples thereof include pyrolytic carbons, cokes, vitreous carbon fibers, organic-polymer-compound fired bodies, activated carbon, and carbon blacks. Examples of cokes include pitch coke, needle coke, and petroleum coke. Organic-polymer-compound fired bodies refer to carbonized materials obtained by firing a phenol resin, a furan resin, or the like at a suitable temperature. In carbon materials, the change in the crystal structure caused by the intercalation or deintercalation of lithium is extremely small Therefore, a high energy density together with excellent cycle characteristics can be obtained, and such a carbon material functions also as a conductive agent. Carbon materials are thus preferable. The carbon material may be in the form of fibers, globules, granules, or scales.

In addition to the above carbon materials, examples of negative electrode materials capable of intercalating and deintercalating lithium also include materials that are capable of intercalating and deintercalating lithium and contain, as a constituent element, at least one kind selected from metal elements and metalloid elements. This is because a high energy density can be obtained. Such a negative electrode material may be a simple substance of a metal or metalloid element, an alloyed metal or metalloid element, a metal or metalloid element compound, or a material at least partially having one or more such phases. "Alloy" herein encompasses, in addition to those including two or more kinds of metal elements, those including one or more kinds of metal elements and one or more kinds of metalloid elements. Such an "alloy" may also contain a nonmetallic element. The structure thereof may be a solid solution, a eutectic crystal (eutectic mixture), an intermetallic compound, or two or more kinds thereof co-existing together.

As such metal elements and metalloid elements, metal elements and metalloid elements capable of forming an alloy with lithium can be mentioned, for example. Specific examples thereof include magnesium (Mg), boron (B), aluminum (Al), gallium (Ga), indium (In), silicon (Si), germanium (Ge), tin (Sn), lead (Pb), bismuth (Bi), cadmium (Cd), silver (Ag), zinc (Zn), hafnium (Hf), zirconium (Zr), yttrium (Y), palladium (Pd), and platinum (Pt). Of these, at least one of silicon and tin is preferable, and silicon is more preferable. This is because they have a high capability of intercalating and deintercalating lithium, so a high energy density can be obtained.

Examples of negative electrode materials containing at least one of silicon and tin include a simple substance of silicon, an alloyed silicon, a silicon compound, a simple substance of tin, an alloyed tin, a tin compound, and materials at least partially having one or more such phases.

Examples of alloys of silicon include those containing, as a second constituent element other than silicon, at least one kind selected from the group consisting of tin (Sn), nickel (Ni), copper (Cu), iron (Fe), cobalt (Co), manganese (Mn), zinc (Zn), indium (In), silver (Ag), titanium (Ti), germanium (Ge), bismuth (Bi), antimony (Sb), and chromium (Cr). Examples of alloys of tin include those containing, as a second constituent element other than tin (Sn), at least one kind selected from the group consisting of silicon (Si), nickel (Ni), copper (Cu), iron (Fe), cobalt (Co), manganese (Mn), zinc (Zn), indium (In), silver (Ag), titanium (Ti), germanium (Ge), bismuth (Bi), antimony (Sb), and chromium (Cr).

Examples of tin compounds and silicon compounds include those containing oxygen (O) or carbon (C). Such a compound may also contain any of the second constituent elements mentioned above in addition to tin (Sn) or silicon (Si).

Particularly preferred examples of negative electrode materials containing at least one of silicon (Si) and tin (Sn) are those containing tin (Sn) as a first constituent element and also containing, in addition to tin (Sn), a second constituent element and a third constituent element. Needless to say, such a negative electrode material may used in combination with the negative electrode material mentioned above. The second constituent element is at least one kind selected from the group consisting of cobalt (Co), iron (Fe), magnesium (Mg), titanium (Ti), vanadium (V), chromium (Cr), manganese (Mn), nickel (Ni), copper (Cu), zinc (Zn), gallium (Ga), zirconium (Zr), niobium (Nb), molybdenum (Mo), silver (Ag), indium (In), cerium (Ce), hafnium (Hf), tantalum (Ta), tungsten (W), bismuth (Bi), and silicon (Si). The third constituent element is at least one kind selected from the group consisting of boron (B), carbon (C), aluminum (Al), and phosphorus (P). This is because the inclusion of the second element and the third element improves cycle characteristics.

Of these, a preferred example is a CoSnC-containing material containing tin (Sn), cobalt (Co), and carbon (C) as constituent elements, in which the content of carbon (C) is within a range of 9.9% by mass to 29.7% by mass, and the proportion of cobalt (Co) based on the total of tin (Sn) and cobalt (Co) (Co/(Sn+Co)) is within a range of 30% by mass to 70% by mass. This is because within such a composition range, a high energy density together with excellent cycle characteristics can be obtained.

The CoSnC-containing material may further contain additional constituent elements as required. Preferred examples of additional constituent elements include silicon (Si), iron (Fe), nickel (Ni), chromium (Cr), indium (In), niobium (Nb), germanium (Ge), titanium (Ti), molybdenum (Mo), aluminum (Al), phosphorus (P), gallium (Ga), and bismuth (Bi). They may be used alone or in combination. This is because capacity characteristics or cycle characteristics are further improved.

The CoSnC-containing material has a phase including tin (Sn), cobalt (Co), and carbon (C), and it is preferable that such a phase has a poorly crystalline or amorphous structure. Further, in the CoSnC-containing material, it is preferable that carbon, a constituent element, is at least partially bonded to a metal element or a metalloid element, an additional constituent element. This is because of the following reason. A decrease in cycle characteristics is attributable to the agglomeration or crystallization of tin (Sn) or the like. When carbon is bonded to another element, such agglomeration or crystallization can be suppressed.

The bonding state of elements can be measured by X-ray photoelectron spectroscopy (XPS), for example. According to XPS, in an apparatus that is energy-calibrated so that the peak of the 4f orbital of gold atom (Au4f) appears at 84.0 eV, when carbon is graphite, the peak of the 1s orbital of carbon (C1s) appears at 284.5 eV. When carbon is surface-contaminated carbon, the peak appears at 284.8 eV. Meanwhile, in the case where the electric charge density of the carbon element is increased, for example, if carbon (C) is bonded to a metal element or a metalloid element, then the peak of C1s appears in a region below 284.5 eV. That is, when the peak of composite wave of C1s obtained from a CoSnC-containing material appears in a region below 284.5 eV, carbon (C) contained in such a CoSnC-containing material is at least partially bonded to a metal element or a metalloid element, an additional constituent element.

In XPS, the peak of C1s is used for the correction of the energy axis of the spectrum, for example. Usually, surface-contaminated carbon is present in the surface. Therefore, the peak of C1s of surface-contaminated carbon is accepted as 284.8 eV and used as the energy reference. The waveform of the peak of C1s obtained in XPS includes the peak of surface-contaminated carbon and the peak of carbon (C) in the CoSnC-containing material. Accordingly, through analysis using a commercially available software, for example, the peak of surface-contaminated carbon and the peak of carbon (C) in the CoSnC-containing material are separated. In the analysis of waveform, the position of the main peak on the minimum-binding-energy side is taken as the energy reference (248.8 eV).

Examples of negative electrode materials capable of intercalating and deintercalating lithium also include metal oxides and polymer compounds capable of intercalating and deintercalating lithium. Examples of metal oxides include iron oxide, ruthenium oxide, and molybdenum oxide. Examples of polymer compounds include polyacethylene, polyaniline, and polypyrrole.

The negative electrode material capable of intercalating and deintercalating lithium may be other than those mentioned above. It is also possible to use a mixture of any combination of two or more kinds of the negative electrode materials mentioned above.

The negative electrode active material layer 22B may be formed by a vapor-phase process, a liquid-phase process, a spraying process, a firing process, coating, or a combination of two or more of these, for example. When the negative electrode active material layer 22B is formed by a vapor-phase process, a liquid-phase process, a spraying process, a firing process, or a combination thereof, it is preferable that the interface between the negative electrode active material layer 22B and the negative electrode collector 22A is at least partially alloyed. Specifically, it is preferable that at the interface, a constituent element of the negative electrode collector 22A is diffused into the negative electrode active material layer 22B, a constituent element of the negative electrode active material layer 22B is diffused into the negative electrode collector 22A, or such constituent elements are mutually diffused. This is because breakage due to the expansion and contraction of the negative electrode active material layer 22B accompanying charging and discharging can be suppressed, and also the electron conductivity between the negative electrode active material layer 22B and the negative electrode collector 22A can be improved.

The vapor-phase process may be physical deposition or chemical deposition, for example. Specific examples thereof include vacuum deposition, sputtering, ion plating, laser ablation, thermal chemical vapor deposition (CVD), and plasma chemical vapor deposition. The liquid-phase process may be a known technique, such as electroplating or electroless plating. The firing process is a method in which, for example, a negative electrode active material in the form of particles is mixed with a binder or the like, dispersed in a solvent, and then applied, followed by a heat treatment at a temperature higher than the melting point of the binder or the like. The firing process may also be a known technique, such as atmospheric firing, reaction firing, or hot-press firing, for example.

(Separator)

Figure 8:
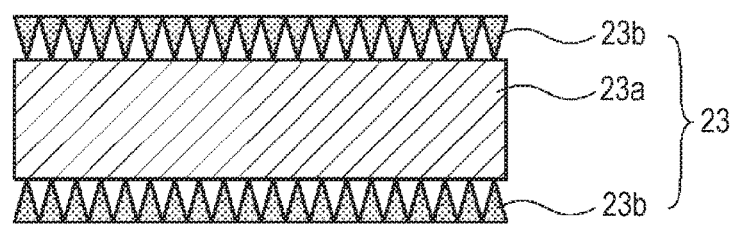
FIG. 8 is a cross-sectional view showing the configuration of a separator.

FIG. 8 is a cross-sectional view showing an example of the configuration of a separator. The separator 23 separates the positive electrode 21 and the negative electrode 22 to keep the current from short-circuiting due to the contact between the electrodes, while allowing ions to pass therethrough. The separator 23 includes a substrate 23a having a first principal surface and a second principal surface, and also includes an inorganic particle membrane 23b formed on at least one of the principal surfaces of the substrate 23a. In order to improve safety, it is preferable that the inorganic particle membrane 23b is formed on each principal surface of the substrate 23a. FIG. 8 shows an example in which the inorganic particle membrane 23b is formed on each principal surface of the substrate 23a. The separator 23 corresponds to the microporous membrane according to the first embodiment shown in FIGS. 1 and 2. That is, the density of inorganic particles is set so that, in the thickness direction of the inorganic particle membrane 23b, it is highest near the outer surface of the inorganic particle membrane 23b. The density of inorganic particles is set so that, in the thickness direction of the inorganic particle membrane 23b, it is lowest near the membrane/substrate interface. The density of inorganic particles is also set so that it gradually decreases, in the thickness direction, from near the outer surface of the inorganic particle membrane 23b to the membrane/substrate interface. Accordingly, in the thickness direction, the voids are smallest near the outer surface of the inorganic particle membrane 23b and are largest near the interface between the inorganic particle membrane 23b and the substrate 23a. The voids gradually decrease in size, in the thickness direction, from the interface between the inorganic particle membrane 23b and the substrate 23a to the outer surface of the inorganic particle membrane 23b.

(Substrate and Inorganic Particle Membrane)

The configurations of the substrate 23a and the inorganic particle membrane 23b are the same as in the first embodiment. Also, like the first embodiment, the inorganic particle membrane 23b preferably has a thickness of 10 nm or more and 1000 nm or less. The reason that a thickness within this range is preferable is the same as in the first embodiment. Further, when the inorganic particle membrane 23b is applied to a battery separator, there are additional reasons as follows. That is, when the thickness of the inorganic particle membrane 23b is more than 1000 nm, the whole thickness of such a separator including the substrate 23a is large, and the battery capacity decreases accordingly. When the thickness of the inorganic particle membrane 23b is less than 10 nm, inorganic particles are not layered, and it may be difficult to sufficiently perform the functions of the embodiments.

(Function of Separator in the Event of Short Circuit)

Figure 9:
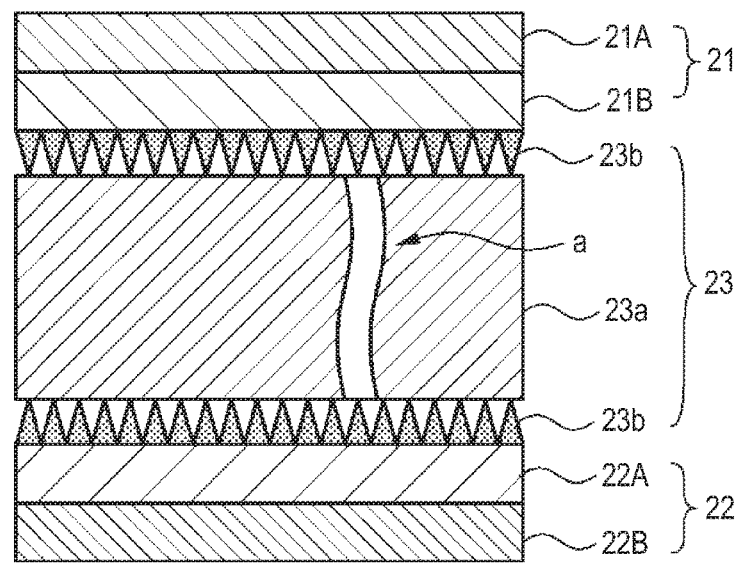
FIG. 9 is a cross-sectional view for explaining functions of a separator.

Functions of the separator 23 will be described with reference to FIG. 9. The separator 23 separates the positive electrode 21 and the negative electrode 22 to keep the current from short-circuiting due to the contact between the electrodes, while allowing lithium ions to pass therethrough. The separator 23 is impregnated with an electrolytic solution.

The separator 23 functions as follows. When a short circuit occurs due to a contaminant between an electrode and the separator 23, first, the pores are closed by thermal changes of the substrate 23a to thereby block the permeation of ions. If the temperature then rises to the melting point of the substrate 23a or higher, the substrate 23a may rupture as indicated by the arrow a.

In such a case, because the porosity is highest near the membrane/substrate interface in the thickness direction of the inorganic particle membrane 23b, and the bond strength at the membrane/substrate interface is thus low, the substrate 23a contracts or ruptures, while the structure of the inorganic particle membrane 23b is maintained. Accordingly, it is possible for the inorganic particle membrane 23b to continue to cover the positive electrode 21 and the negative electrode 22.

When there is one inorganic particle membrane 23b on either the positive electrode 21 side or the negative electrode 22 side, it functions as above in the event of a short circuit. However, in order to improve the functions, it is preferable that the inorganic particle membrane 23b is disposed on each of the positive electrode 21 side and the negative electrode 22 side, as shown in FIG. 9.

In addition, as shown in the first to eighth variations of the microporous membrane above, the thickness of the inorganic particle membrane 23b and the variation of voids can be suitably controlled according to the roughness of the electrode surface, the softness and puncture resistance of the substrate 23a, etc., so as to optimize the effects in maintaining the covering even when the substrate 23a ruptures. In order to deal with the entry of contaminants, it is also possible to provide the separator with a multilayer structure to thereby enhance the functions, as shown in the fifth to eighth variations of the microporous membrane.

(Electrolytic Solution)

The electrolytic solution may be a nonaqueous electrolytic solution obtained by dissolving an electrolyte salt in a nonaqueous solvent. The nonaqueous solvent preferably contains either ethylene carbonate or propylene carbonate, which is a cyclic carbonate. In addition, linear carbonates such as diethyl carbonate, dimethyl carbonate, ethyl methyl carbonate, and methyl propyl carbonate are also usable.

It is preferable that the nonaqueous solvent further contains at least one of 2,4-difluoroanisole and vinylene carbonate.

The nonaqueous solvent may further contain one or more of butylene carbonate, γ-butyrolactone, γ-valerolactone, these compounds with a part or all of the hydroxyl groups thereof being substituted with fluorine groups, 1,2-dimethoxyethane, tetrahydrofuran, 2-methyltetrahydrofuran, 1,3-dioxolane, 4-methyl-1,3-dioxolane, methyl acetate, methyl propionate, acetonitrile, glutaronitrile, adiponitrile, methoxyacetonitrile, 3-methoxypropyronitrile, N,N-dimethylformamide, N-methylpyrrolidinone, N-methyloxazolidinone, N,N-dimethylimidazolidinone, nitromethane, nitroethane, sulfolane, dimethylsulfoxide, trimethyl phosphate, and the like.

Depending on the electrode to be combined, the reversibility of an electrode reaction may be improved by the use of a substance of the above group of nonaqueous solvents, a part or all of whose hydrogen atoms are substituted with fluorine atoms. Therefore, such substances may also be suitably used.

Examples of suitable lithium salts as electrolyte salts include $LiPF_6$, $LiBF_4$, $LiAsF_6$, $LiClO_4$, $LiB(C_6H_5)_4$, $LiCH_3SO_3$, $LiCF_3SO_3$, $LiN(SO_2CF_3)_2$, $LiC(SO_2CF_3)_3$, $LiAlCl_4$, $LiSiF_6$, LiCl, $LiBF_2(ox)$ [lithium difluoro(oxalate)borate], LiBOB [lithium bis(oxalate)borate], and LiBr. They may be used alone or in combination. Of these, $LiPF_6$ gives high ion conductivity together with improved cycle characteristics, and thus is preferable.

(Method for Producing Nonaqueous Electrolyte Battery)

The nonaqueous electrolyte battery can be produced as follows.

(Production of Positive Electrode)

A positive electrode active material, a positive electrode electric conductor, and a positive electrode binder are mixed to prepare a positive electrode mixture, and the positive electrode mixture is dispersed in a solvent, such as N-methyl-2-pyrrolidone, to give a positive electrode mixture slurry. Next, the positive electrode mixture slurry is applied to a positive electrode collector 21A, followed by drying of the solvent, and then pressed with a roll press or the like into a positive electrode active material layer 21B. A positive electrode 21 is thus obtained.

(Production of Negative Electrode)

A negative electrode active material and a negative electrode binder are mixed to prepare a negative electrode mixture, and the negative electrode mixture is dispersed in a solvent, such as N-methyl-2-pyrrolidone, to give a negative electrode mixture slurry. Next, the negative electrode mixture slurry is applied to a negative electrode collector 22A, followed by drying the solvent, and then pressed with a roll press or the like into a negative electrode active material layer 22B. A negative electrode 22 is thus obtained.

(Production of Separator)

A separator 23 is produced in the same manner as in the production of the microporous membrane according to the first embodiment.

(Assembly of Battery)

Next, a positive electrode lead 25 and a negative electrode lead 26 are attached to the positive electrode collector 21A and the negative electrode collector 22A, respectively, by welding or the like. Next, the positive electrode 21 and the negative electrode 22 are wound via the separator 23. An end portion of the positive electrode lead 25 is then welded to a safety valve mechanism 15, while an end portion of the negative electrode lead 26 is welded to a battery can 11. The wound positive electrode 21 and negative electrode 22 are then sandwiched between a pair of insulating plates 12 and 13, and housed in the battery can 11.

Next, an electrolytic solution is poured into the battery can 11 to impregnate the separator 23 with the electrolytic solution. Next, the battery cover 14, the safety valve mechanism 15, and a PTC device 16 are fixed to the open end of the battery can 11 by caulking via a gasket 17. The nonaqueous electrolyte battery according to the second embodiment of the invention is thus obtained.

<Effect>

In the second embodiment, the separator used has improved strength while maintaining ion permeability. Therefore, excellent battery characteristics can be obtained. Further, in the separator, for example, the inorganic particle membrane can be configured to have, in the thickness direction thereof, a sparse region with larger voids near the membrane/substrate interface, thereby maintaining the covering even when a meltdown occurs in the separator. Accordingly, safety can be improved. In addition, the formation of the inorganic particle membrane makes it possible to reduce the thickness of the separator. Therefore, also in terms of battery capacity, excellent characteristics can be obtained.

3. Third Embodiment

A nonaqueous electrolyte battery according to a third embodiment will be described. The nonaqueous electrolyte battery according to the third embodiment is a nonaqueous electrolyte battery using a gel electrolyte made of a polymer compound that holds an electrolytic solution.

(Configuration of Battery)

Figure 10:
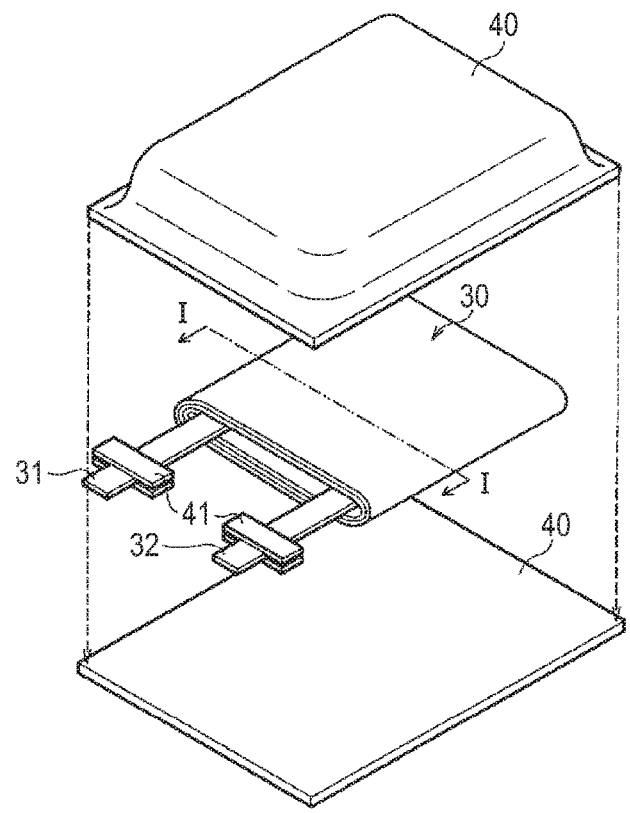
FIG. 10 is a cross-sectional view showing the configuration of a nonaqueous electrolyte battery according to a third embodiment.

FIG. 10 shows the configuration of the nonaqueous electrolyte battery of the third embodiment. As shown in FIG. 10, the nonaqueous electrolyte battery includes an wound electrode assembly 30 housed in an outer packaging material 40 made a moisture-proof laminate film, the periphery of the wound electrode assembly 30 being sealed by welding. The wound electrode assembly 30 includes a positive electrode lead 31 and a negative electrode lead 32. These leads are inserted into the outer packaging material 40 and extend outside. The positive electrode lead 31 and the negative electrode lead 32 each have adhesion films 41 on both sides thereof for improving the adhesion with the outer packaging material 40.

(Outer Packaging Material)

The outer packaging material 40 has a laminated structure including an adhesion layer, a metal layer, and a surface protection layer that are sequentially laminated, for example. The adhesion layer is formed of a polymer film. Examples of materials for the polymer film include polypropylene (PP), polyethylene (PE), cast polypropylene (CPP), linear low-density polyethylene (LLDPE), and low-density polyethylene (LDPE). The metal layer is formed of a metallic foil. Examples of materials for the metallic foil include aluminum (Al). It is also possible to use a metal other than aluminum as a material for the metallic foil. Examples of materials for the surface protection layer include nylon (Ny) and polyethylene terephthalate (PET). The adhesion-layer-side surface serves as the housing surface for housing the wound electrode assembly 30.

(Wound Electrode Assembly)

Figure 11:
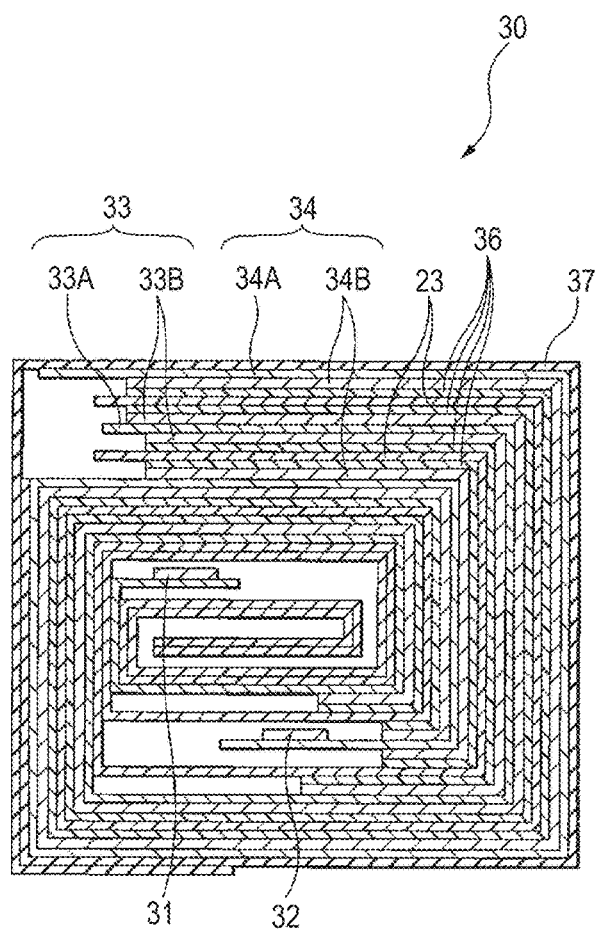
FIG. 11 is a cross-sectional view showing the configuration of a wound electrode assembly according to an embodiment.

The wound electrode assembly 30 is, for example, as shown in FIG. 11, a wound-type wound electrode assembly 30 including a strip-like negative electrode 34 having the gel electrolyte 36 on each side thereof, a separator 23, a strip-like positive electrode 33 having the gel electrolyte 36 on each side thereof, and a separator 23 that are laminated and wound in the longitudinal direction. The configuration and the like of the separator 23 are the same as in the first embodiment, so a detailed description is omitted here.

The positive electrode 33 includes a strip-like positive electrode collector 33A and a positive electrode active material layer 33B formed on each side of the positive electrode collector 33A. The positive electrode collector 33A is a metallic foil made of aluminum, for example.

The positive electrode 33 has a positive electrode lead 31 connected to a longitudinal end thereof by spot welding or ultrasonic welding, for example. The positive electrode lead 31 may be made of a metal such as aluminum, for example.

The negative electrode 34 includes a strip-like negative electrode collector 34A and a negative electrode active material layer 34B formed on each side of the negative electrode collector 34A. The negative electrode collector 34A is formed of a metallic foil such as a copper (Cu) foil, a nickel foil, or a stainless steel foil, for example.

Like the positive electrode 33, the negative electrode 34 also has a negative electrode lead 32 connected to a longitudinal end thereof by spot welding or ultrasonic welding, for example. The negative electrode lead 32 may be made of copper (Cu), nickel (Ni), or the like, for example.

The battery configuration is the same as in the second embodiment except for the gel electrolyte 36. The description of the gel electrolyte 36 will be given hereinafter.

The gel electrolyte 36 includes an electrolytic solution and a polymer compound that serves as a holding material to hold the electrolytic solution, and is in the form of a so-called gel. The gel electrolyte 36 can provide high ion conductivity and also allows the suppression of liquid leakage from the battery. The gel electrolyte 36 is thus preferable. The configuration of the electrolytic solution (i.e., liquid solvent, electrolyte salt, and additives) is the same as in the second embodiment.

Examples of polymer compounds include polyacrylonitrile, polyvinylidene fluoride, copolymers of vinylidene fluoride and hexafluoropropylene, polytetrafluoroethylene, polyhexafluoropropylene, polyethylene oxide, polypropylene oxide, polyphosphazene, polysiloxane, polyvinyl acetate, polyvinyl alcohol, polymethyl methacrylate, polyacrylic acid, polymethacrylic acid, styrene-butadiene rubber, nitrile-butadiene rubber, polystyrene, and polycarbonate. In particular, in terms of electrochemical stability, polyacrylonitrile, polyvinylidene fluoride, polyhexafluoropropylene, and polyethylene oxide are preferable.

(Method for Producing Battery)

The nonaqueous electrolyte battery is produced as follows, for example.

First, a precursor solution including an electrolytic solution, a polymer compound, and a mixed solvent is prepared. The precursor solution is applied to a positive electrode 33 and a negative electrode 34, and then the mixed solvent is volatilized to give an electrolyte 36. Subsequently, a positive electrode lead 31 is attached to the positive electrode collector 33A, and a negative electrode lead 32 is attached to the negative electrode collector 34A.

Subsequently, the positive electrode 33 and the negative electrode 34 each having formed thereon the electrolyte 36 are laminated via a separator 35, the resulting laminate is wound in its longitudinal direction, and a protection tape 37 is attached to the outermost periphery thereof to form a wound electrode assembly 30. Subsequently, for example, the wound electrode assembly 30 is wrapped in an outer packaging material 40, and the marginal portions of the outer packaging material 40 are brought into close contact with each other by heat sealing or the like to enclose the wound electrode assembly 30 therein. At this time, an adhesion film 41 is inserted between the positive electrode lead 31 and the outer packaging material 40 and also between the negative electrode lead 32 and the outer packaging material 40. The battery shown in FIGS. 10 and 11 can thus be obtained.

The nonaqueous electrolyte battery may also be produced as follows.

First, a positive electrode lead 31 and a negative electrode lead 32 are attached to a positive electrode 33 and a negative electrode 34, respectively. Then, the positive electrode 33 and the negative electrode 34 are laminated via a separator 35, the resulting laminate is wound, and a protection tape 37 is attached to the outermost periphery thereof to form a wound body that is a precursor of a wound electrode assembly 30.

Next, the wound body is wrapped in an outer packaging material 40, and marginal portions thereof except for one side are brought into close contact with each other by heat sealing or the like, whereby the wound body is housed in the pouch-like outer packaging material 40. Next, an electrolyte-forming composition, which includes an electrolytic solution, a monomer that is the raw material of a polymer compound, and a polymerization initiator, optionally together with a polymerization inhibitor or other materials, is prepared. The composition is poured into the pouch-like outer packaging material 40, and the opening of the outer packaging material 40 is then hermetically sealed by heat sealing, etc. Finally, the monomer is heat-polymerized into a polymer compound, thereby forming a gel electrolyte 36. The battery shown in FIGS. 10 and 11 can thus be obtained.

The nonaqueous electrolyte battery may also be produced as follows.

First, a positive electrode lead 31 and a negative electrode lead 32 are attached to a positive electrode 33 and a negative electrode 34, respectively. Next, the positive electrode 33 and the negative electrode 34 are laminated via a separator 35 having a polymer compound on both sides, the resulting laminate is wound, and a protection tape 37 is attached to the outermost periphery thereof to form a wound electrode assembly 30.

The polymer compound may be a polymer containing vinylidene fluoride as a component, that is, a homopolymer, a copolymer, or a multicomponent copolymer, for example. Specific examples thereof include polyvinylidene fluoride, binary copolymers containing vinylidene fluoride and hexafluoropropylene as components, and ternary copolymers containing vinylidene fluoride, hexafluoropropylene, and chlorotrifluoroethylene as components. The polymer compound may also contain, together with the polymer that contains vinylidene fluoride as a component, one or more additional polymer compounds.

Next, the above electrolytic solution is poured into the outer packaging material 40, and the opening of the outer packaging material 40 is then hermetically sealed by heat sealing, etc. Finally, the outer packaging material 40 is heated under weight, so that the separator 35 comes into close contact with the positive electrode 33 and the negative electrode 34 via the polymer compound. As a result, the polymer compound is impregnated with the electrolytic solution, and the polymer compound undergoes gelation to form an electrolyte 36. The nonaqueous electrolyte battery shown in FIGS. 10 and 11 can thus be obtained.

<Effect>

The third embodiment has the same effects as the second embodiment.

4. Fourth Embodiment

A nonaqueous electrolyte battery according to a fourth embodiment will be described. The nonaqueous electrolyte battery according to the fourth embodiment is the same as the nonaqueous electrolyte battery according to the third embodiment, except that the fourth embodiment does not use an electrolytic solution held by a polymer compound (electrolyte 36) but instead directly uses an electrolytic solution. Therefore, the details of the configuration will be described, focusing on the differences from the third embodiment.

(Configuration of Battery)

The nonaqueous electrolyte battery according to the fourth embodiment uses an electrolytic solution in place of the gel electrolyte 36. Therefore, its wound electrode assembly 30 is configured not to include the electrolyte 36, and a separator 23 is impregnated with the electrolytic solution.

(Method for Producing Battery)

The nonaqueous electrolyte battery is produced as follows, for example.

First, for example, a positive electrode active material, a positive electrode binder, and a positive electrode conductive agent are mixed to prepare a positive electrode mixture. The positive electrode mixture is dispersed in a solvent, such as N-methyl-2-pyrrolidone, thereby producing a positive electrode mixture slurry. Next, the positive electrode mixture slurry is applied to each side of a positive electrode collector 33A, dried, and then pressed into a positive electrode active material layer 33B. A positive electrode 33 is thus produced. Next, for example, a positive electrode lead 31 is attached to the positive electrode collector 33A by ultrasonic welding, spot welding, or the like, for example.

Further, for example, a negative electrode active material and a negative electrode binder are mixed to prepare a negative electrode mixture. The negative electrode mixture is dispersed in a solvent, such as N-methyl-2-pyrrolidone, thereby producing a negative electrode mixture slurry. Next, the negative electrode mixture slurry is applied to each side of a negative electrode collector 34A, dried, and then pressed into a negative electrode active material layer 34B. A negative electrode 34 is thus produced. Next, for example, a negative electrode lead 32 is attached to the negative electrode collector 34A by ultrasonic welding, spot welding, or the like, for example.

Subsequently, the positive electrode 33 and the negative electrode 34 are wound via a separator 23 and placed inside an outer packaging material 40, and an electrolytic solution is poured into the outer packaging material 40. The outer packaging material 40 is then hermetically sealed. The nonaqueous electrolyte battery shown in FIGS. 10 and 11 can thus be obtained.

<Effect>

The nonaqueous electrolyte battery according to the fourth embodiment has the same effects as the second embodiment.

EXAMPLES

Hereinafter, the embodiments will be described in further detail with reference to Examples. In the Examples and the Comparative Examples, the density and the porosity of an inorganic particulate membrane were measured as follows.

(Measurement of Porosity)

In the measurement of porosity, a gravimetric method, a mercury intrusion porosimeter, and a gas adsorption measuring apparatus were employed. In the case of thinner films, image analysis using a TEM photograph was also employed to determine the porosity.

The gravimetric method was performed as follows. The weight (M1) and thickness (T1) of a PE porous membrane after the formation of an inorganic particle membrane and the weight (M0) and thickness (T0) of the PE porous membrane alone before the formation of an inorganic particle membrane were each measured using a precision balance and a noncontact film thickness gauge. Considering the deposition site and variations in the PE porous membrane, an average was obtained from a plurality of samples. From the obtained values, the average porosity of the inorganic particle membrane was calculated by the following equation.

$$\text{Porosity (\%)} = [1 - (M1 - M2)/\{(T1 - T0) \times A \times \rho\}] \times 100$$

In the equation, A is a sample deposition area, and ρ is a density of inorganic substances.

The porosity at each site in the thickness direction was determined as follows. Changing the shutter position in a deposition apparatus of FIG. 3, a sample formed by deposition only at a shallow angle (about 45°), a sample formed by deposition at deep angles (up to 60°), a sample formed by deposition at deeper angles (up to 75°), and also a multi-stage sample were prepared, and a calculation was performed using the above equation. The average porosity at each site was thus obtained.

With respect to some samples, voids were also measured using a mercury intrusion porosimeter and a gas adsorption measuring apparatus. In this case, in order to avoid the influence of the voids of the PE microporous membrane substrate itself, an inorganic particle membrane was formed on a polyethylene terephthalate (PET) film, which is for use in a recording media cassette tape, by deposition under the same conditions, and the porosity of such a sample was calculated.

Further, in the case of thin inorganic particle membranes that cause large measurement errors, the porosity was determined from the porosity at each site obtained above and also by image analysis using a TEM (Transmission Electron Microscope) photograph.

(Density)

From the porosity determined in the above measurement, the density was calculated based on the following equation.

$$(\text{Density}) = \{100 - (\text{porosity})\}[\%].$$

Example A-1

A polyethylene microporous membrane (hereinafter referred to as a PE porous membrane) having a thickness of 16 μm and a porosity of 40% was prepared. On each principal surface of the PE porous membrane, an inorganic particle membrane (aluminum oxide ($Al_2O_3$) membrane) was formed using the deposition apparatus shown in FIG. 3 under the following deposition conditions. A microporous membrane of Example A-1 was thus produced.

(Deposition Conditions)

Metal material: Aluminum

Incidence angle: 45° to 0° (vertical direction)

Introduced gas: Oxygen gas

Amount of oxygen introduced: $3.3 \times 10^{-6}$ m$^3$/sec

Degree of vacuum: $2.0 \times 10^{-2}$ Pa

Film thickness: 10 nm

Secondary particle diameter: Several nanometers to several ten nanometers

Example A-2

A microporous membrane of Example A-2 was produced in the same manner as in Example A-1, except that the thickness of the aluminum oxide membrane was 100 nm.

Figure 12:
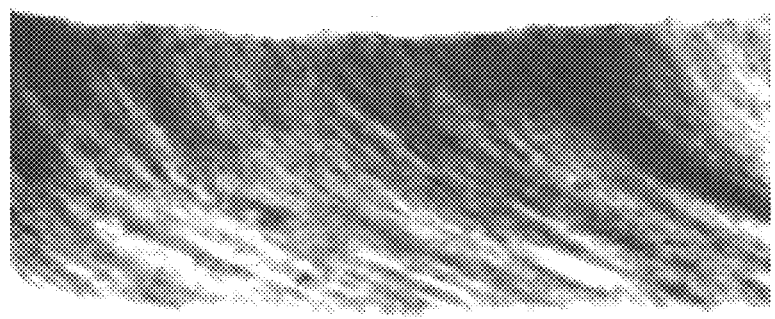
FIG. 12 shows a TEM image of an inorganic particle membrane of Example A-2.

A cross section of an inorganic particle membrane of the microporous membrane of Example A-2 was observed by TEM (Transmission Electron Microscope). FIG. 12 shows a TEM image thereof. In FIG. 12, the upper side is the outer surface side, while the lower side is the side facing the PE porous membrane. It was found that, as shown in FIG. 12, in the thickness direction of the inorganic particle membrane, voids were smaller near the outer surface and larger near the interface between the inorganic particle membrane and the PE porous membrane. It was also found that the voids gradually decrease in size, in the thickness direction of the inorganic particle membrane, from the outer surface to the PE porous membrane.

Example A-3

A microporous membrane of Example A-3 was produced in the same manner as in Example A-1, except that the thickness of the aluminum oxide membrane was 300 nm.

Example A-4

A microporous membrane of Example A-4 was produced in the same manner as in Example A-1, except that the thickness of the aluminum oxide membrane was 500 nm.

Example A-5

A microporous membrane of Example A-5 was produced in the same manner as in Example A-1, except that the thickness of the aluminum oxide membrane was 800 nm.

Example A-6

A microporous membrane of Example A-6 was produced in the same manner as in Example A-1, except that the thickness of the aluminum oxide membrane was 1000 nm.

Comparative Example A-1

A PE porous membrane was employed as a microporous membrane of Comparative Example A-1.

Comparative Example A-2

In Comparative Example A-2, aluminum oxide particulates were formed on each principle surface of a PE porous membrane by wet application. First, 24 parts by weight of alumina powder with an average particle diameter of about 0.6 μm, 1 part by weight of PVDF as a binder, and 16 parts by weight of N-methylpyrrolidone as a solvent were mixed in a roll mill to give a particulate slurry. The particulate slurry was applied, dried, and pressed to form an aluminum oxide membrane on each side of the PE porous membrane. The thickness of the obtained aluminum oxide membrane after pressing was about 2000 nm. A microporous membrane of Comparative Example A-2 was thus produced.

The microporous membranes of Examples A-1 to A-6 and the microporous membranes of Comparative Examples A-1 and A-2 were subjected to the following tests.

(Permeation Test: Measurement of Gurley Number)

Gas permeability correlated with ion permeability was measured according to JIS P8117 using a Gurley densometer manufactured by Tozai Seiki Co., Ltd.

Evaluations were made based on the following criteria on a scale of three grades.

Not less than 500 sec/100 ml (reference value) and less than 700 sec/ml: Excellent Not less than 700 sec/ml: Fair 1000 sec/ml: Poor The reference value, 500 sec/100 ml, is based on a value measured from the PE porous membrane of Comparative Example A-1 having no inorganic particle membrane (about 500 sec/100 ml).

(Short Circuit Test)

Figure 13:
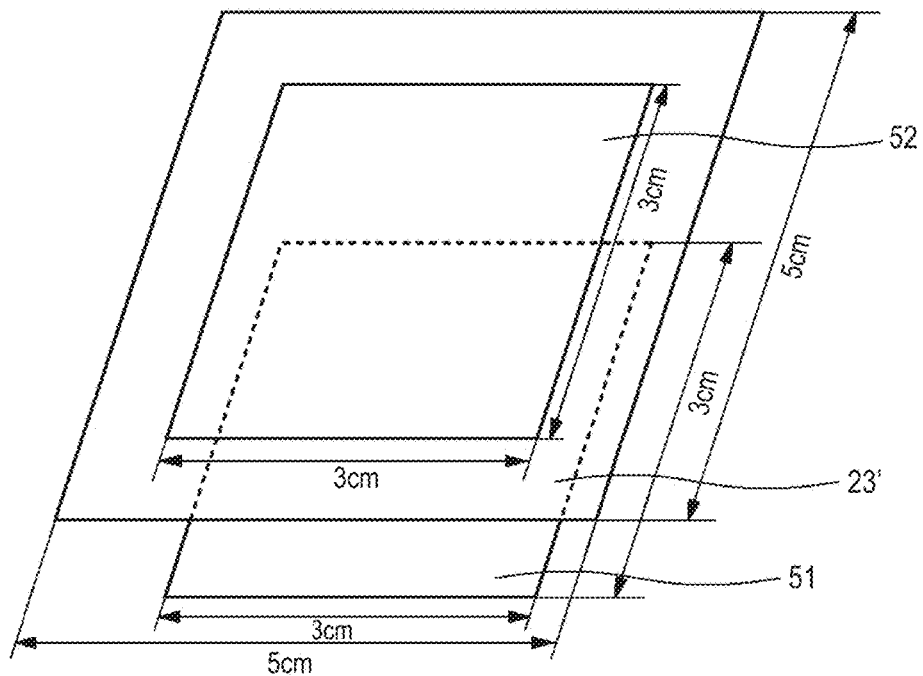
FIG. 13 is a schematic diagram for explaining a short circuit test.
Figure 14:
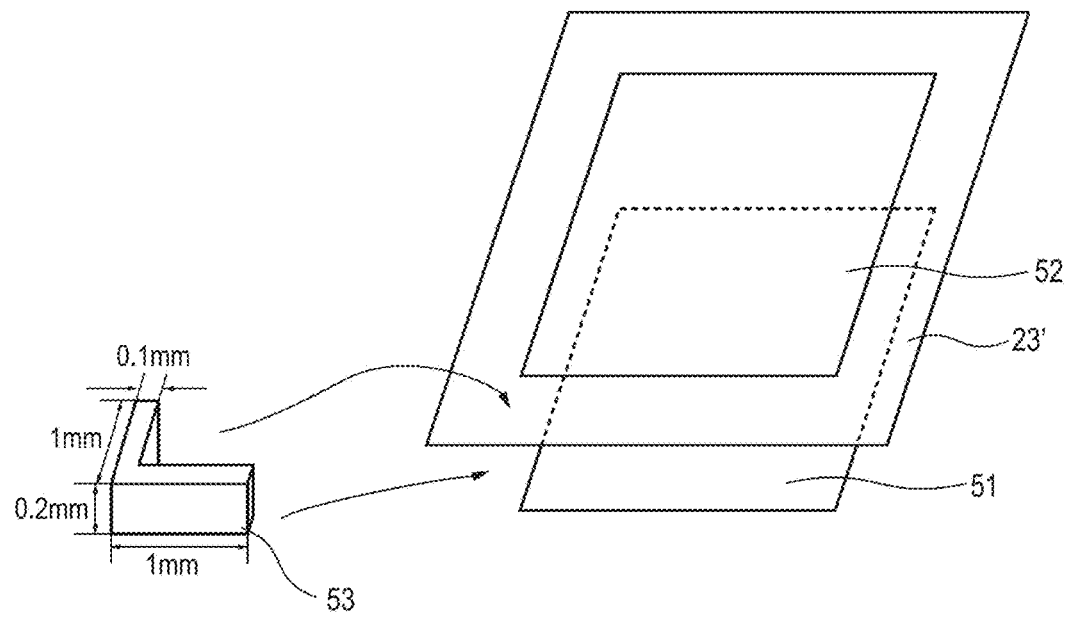
FIG. 14 is a schematic diagram for explaining a short circuit test.

The following describes the details of a short circuit test with reference to FIGS. 13 to 15. First, as shown in FIG. 13, an aluminum foil 51 and a copper foil 52 were each cut to a size of about 3×3 cm, and a microporous membrane 23' cut to a size of 5×5 cm was sandwiched therebetween. Next, as shown in FIG. 14, an L-shaped nickel piece 53 specified in JIS C8714 (Safety tests for portable Lithium Ion secondary cells and batteries for use in portable electronic applications), Section 5.5.2, was placed between the microporous membrane 23' and the aluminum foil 51 or between the microporous membrane 23' and the copper foil 52. A test sample was thus obtained.

At this time, the nickel piece 53 arranged in such a manner that the L-shaped surfaces thereof are in contact with the microporous membrane 23' and the aluminum foil 51 or the copper foil 52. Next, as shown in FIG. 15, the aluminum foil 51 and the copper foil 52 were connected to a power supply (12 V, 25 A), and the test sample was placed on a polypropylene plate 54 in such a manner that the aluminum-foil-51 side of the test sample faces the polypropylene plate 54. Next, the test sample was compressed from above at a rate of 0.1 mm/sec. At this time, the circuit voltage, the voltage across a 0.1-Ω shunt resistor 57 connected in series with the circuit, and data from a load cell 55 attached to the compression member were recorded by a data logger 56 at a sampling rate of 1 msec.

Next, compression was performed until the load cell 55 attached to the compression member indicated 98N, allowing the microporous membrane 23' to rupture. At the same time, the resistance upon the occurrence of a short circuit was calculated from voltage and current (calculated from the shunt resistance voltage). The resistance was calculated from an average of the voltages and that of currents for 1 second after the occurrence of a short circuit.

When the resistance upon the occurrence of a short circuit in this test is 1Ω or higher, high current generation can be suppressed, whereby abnormal heat generation can be suppressed. Accordingly, safety can be improved. Also in this evaluation, the result from Comparative Example A-1 was taken as a reference (Fair), and a higher resistance and a lower resistance were evaluated as Excellent and Poor, respectively.

The evaluation results of the permeation test and the short circuit test are shown in Table 1.

TABLE 1

| | Thickness of Inorganic Particle Membrane [nm] | Density [%] Max-Min | Porosity [%] Max-Min | Permeation Test | Short Circuit Test |
|---|---|---|---|---|---|
| Example A-1 | 0 | 70-50 | 50-30 | Excellent | Excellent |
| Example A-2 | 100 | 80-40 | 60-20 | Excellent | Excellent |
| Example A-3 | 300 | 80-40 | 60-20 | Excellent | Excellent |
| Example A-4 | 500 | 80-40 | 60-20 | Excellent | Excellent |
| Example A-5 | 800 | 80-40 | 60-20 | Excellent | Excellent |
| Example A-6 | 1000 | 80-40 | 60-20 | Excellent | Excellent |
| Comparative Example A-1 | 0 | — | — | Excellent | Fair |
| Comparative Example A-2 | 200 | 70-70 | 30-30 | Fair | Excellent |

As shown in Table 1, in Examples A-1 to A-6, an improvement in performance on short-circuiting was achieved, while maintaining a gas permeability (Gurley number), an index of ion permeation, similar to that of the PE porous membrane of Comparative Example A-1 which has been widely used.

In addition, the Young's modulus not shown in the data was also improved by the formation of an inorganic particle membrane, and this was effective not only in improving the fracture strength of a separator but also in improving handleability in the production and stabilizing the production process.

In contrast, with respect to the sample of Comparative Example A-2 having a membrane formed by application, the formation of the membrane caused a decrease in the gas permeability. As a result, the gas permeability of the PE porous membrane was rarely maintained.

(Rigidity Test)

The flexural rigidity of an inorganic particle membrane was measured according to JIS P8143. As a result, an inorganic particle membrane was found to have a rigidity about 10 times or more that of a PE porous membrane. This shows that a 20-μm-thick PE porous membrane having a 100-nm-thick aluminum oxide membrane on each side thereof has similar flexural rigidity to a 25-μm-thick PE porous membrane.

As a result, it was confirmed that a microporous membrane having formed thereon an inorganic particle membrane has sufficient strength even when the thickness thereof is small. By reducing the thickness of a microporous membrane (separator) which does not directly contribute to battery characteristics, the battery capacity per unit volume can be relatively increased. For example, in the case of a cylindrical battery in which the positive and negative electrodes each have a thickness 100 μm, theoretically, the capacity can be improved by 4% or more.

Example B-1

The incidence angle and the deposition speed were varied to control the density, so that the density gradually decreased, in the thickness direction, from the outermost-surface side to the interface between an inorganic particle membrane and a porous membrane. At this time, the maximum and minimum values of density were set at 80% and 30%, respectively. In otherwise the same manner as in Example A-2, a microporous membrane of Example B-1 was produced.

Example B-2

A microporous membrane of Example B-2 was produced in the same manner as in Example B-1, except that the maximum and minimum values of density were set at 80% and 40%, respectively.

Example B-3

A microporous membrane of Example B-3 was produced in the same manner as in Example B-1, except that the maximum and minimum values of density were set at 80% and 50%, respectively.

Example B-4

A microporous membrane of Example B-4 was produced in the same manner as in Example B-1, except that the maximum and minimum values of density were set at 80% and 60%, respectively.

Example B-5

A microporous membrane of Example B-5 was produced in the same manner as in Example B-1, except that the maximum and minimum values of density were set at 60% and 40%, respectively.

Example B-6

A microporous membrane of Example B-6 was produced in the same manner as in Example B-1, except that the maximum and minimum values of density were set at 70% and 40%, respectively.

Example B-7

A microporous membrane of Example B-7 was produced in the same manner as in Example B-1, except that the maximum and minimum values of density were set at 80% and 40%, respectively.

Example B-8

A microporous membrane of Example B-8 was produced in the same manner as in Example B-1, except that the maximum and minimum values of density were set at 85% and 40%, respectively.

Comparative Example B-1

The incidence angle and the deposition speed were varied to control the density, so that the density was almost constant in the thickness direction. In this example, the density was set at 40%. In otherwise the same manner as in Example A-2, a microporous membrane of Comparative Example B-1 was produced.

Comparative Example B-2

A microporous membrane of Comparative Example B-2 was produced in the same manner as in Comparative Example B-1, except that the density was set at 60%.

Comparative Example B-3

A microporous membrane of Comparative Example B-3 was produced in the same manner as in Comparative Example B-1, except that the density was set at 80%.

Comparative Example B-4

A microporous membrane of Comparative Example B-4 was produced in the same manner as in Comparative Example B-1, except that the density was set at 90%.

The samples of Examples B-1 to B-4 and Comparative Examples B-1 to B-4 were subjected to a permeation test and a short circuit test. The measurement results are shown in Table 2.

TABLE 2

| | Thickness of Inorganic Particle Membrane [nm] | Density [%] Max-Min | Porosity [%] Max-Min | Permeation Test | Short Circuit Test |
|---|---|---|---|---|---|
| Example B-1 | 100 | 80-30 | 70-20 | Excellent | Excellent |
| Example B-2 | 100 | 80-40 | 60-20 | Excellent | Excellent |
| Example B-3 | 100 | 80-50 | 50-20 | Excellent | Excellent |
| Example B-4 | 100 | 80-60 | 40-20 | Excellent | Excellent |
| Example B-5 | 100 | 60-40 | 60-40 | Excellent | Excellent |
| Example B-6 | 100 | 70-40 | 60-30 | Excellent | Excellent |
| Example B-7 | 100 | 80-40 | 60-20 | Excellent | Excellent |
| Example B-8 | 100 | 85-40 | 60-15 | Excellent | Excellent |
| Comparative Example B-1 | 100 | 40-40 | 60-60 | Excellent | Excellent |
| Comparative Example B-2 | 100 | 60-60 | 40-40 | Excellent | Excellent |
| Comparative Example B-3 | 100 | 80-80 | 20-20 | Fair | Excellent |
| Comparative Example B-4 | 100 | 90-90 | 10-10 | Poor | Excellent |

As shown in Table 2, in Examples B-1 to B-8, an improvement in performance on short-circuiting was achieved, while maintaining a gas permeability (Gurley number), an index of ion permeation, similar to that of the PE porous membrane of Comparative Example A-1 which has been widely used. In Comparative Examples B-1 and B-2, although the permeability and the performance on short-circuiting were excellent, an escape of inorganic substances from the inorganic particle membrane was observed. In Comparative Examples B-3 and B-4, the results of the permeation test were not excellent.

Example C-1

A microporous membrane of Example C-1 was produced in the same manner as in Example A-2, except that the average second particle diameter of aluminum oxide was controlled to be 5 nm.

Example C-2

A microporous membrane of Example C-2 was produced in the same manner as in Example C-1, except that the average second particle diameter of aluminum oxide was controlled to be 10 nm.

Example C-3

A microporous membrane of Example C-3 was produced in the same manner as in Example C-1, except that the average second particle diameter of aluminum oxide was controlled to be 20 nm.

Example C-4

A microporous membrane of Example C-4 was produced in the same manner as in Example C-1, except that the average second particle diameter of aluminum oxide was controlled to be 30 nm.

The samples of Examples C-1 to C-4 were subjected to a permeation test and a short circuit test. The measurement results are shown in Table 3.

TABLE 3

| | Average Second Particle Diameter [nm] | Thickness of Inorganic Particle Membrane [nm] | Density [%] Max-Min | Porosity [%] Max-Min | Permeation Test | Short Circuit Test |
|---|---|---|---|---|---|---|
| Example C-1 | 5 | 100 | 80-50 | 50-20 | Excellent | Excellent |
| Example C-2 | 10 | 100 | 80-50 | 50-20 | Excellent | Excellent |
| Example C-3 | 20 | 100 | 80-50 | 50-20 | Excellent | Excellent |
| Example C-4 | 30 | 100 | 80-50 | 50-20 | — | Excellent |

As shown in Table 3, in Examples C-1 to C-4, the average second particle diameters are within the optimal range. Accordingly, the results of the permeation test and the short circuit test were excellent. However, in the Example C-4, the average second particle diameter is above the optimal range. Accordingly, it was difficult to obtain excellent gas permeability.

Example D-2

A microporous membrane of Example D-2 was produced in the same manner as in Example A-2, except that titanium was used as the deposition source in place of aluminum, and that a titanium oxide ($TiO_2$) membrane was formed on each side of a PE porous membrane.

Example D-3

A microporous membrane of Example D-3 was produced in the same manner as in Example A-2, except that copper was used as the deposition source in place of aluminum, and that a copper oxide ($CuO$) membrane was formed on each side of a PE porous membrane.

The samples of Examples D-2 and D-3 were subjected to a permeation test and a short circuit test. The measurement results are shown in Table 4.

TABLE 4

| | Material | Thickness of Inorganic particle membrane [nm] | Density [%] Max-Min | Porosity [%] Max-Min | Permeation Test | Short Circuit Test |
|---|---|---|---|---|---|---|
| Example A-2 | $Al_2O_3$ | 100 | 80-40 | 60-20 | Excellent | Excellent |
| Example D-2 | $TiO_2$ | 100 | 80-40 | 60-20 | Excellent | Excellent |
| Example D-3 | CuO | 100 | 80-40 | 60-20 | Excellent | Excellent |

As shown in Table 4, also in the case where a titanium oxide membrane or a copper oxide membrane was formed, an improvement in performance on short-circuiting was achieved, while maintaining a gas permeability (Gurley number), an index of ion permeation, similar to that of the PE porous membrane of Comparative Example A-1 which has been widely used.

Example E-1

A microporous membrane of Example E-1 was configured so that, in the thickness direction, the density gradually increased from the outermost surface to the interface between an inorganic particle membrane and a porous membrane. In order to achieve such a configuration, the drum was rotated in the opposite direction from that in Example A-2 (the PE porous membrane feed side and take-up side were reversed) to produce an aluminum oxide membrane. In otherwise the same manner as in Example A-2, the microporous membrane of Example E-1 was produced.

Example F-1

A microporous membrane of Example F-1 was produced in the same manner as in Example A-2, except that an aluminum oxide membrane was formed only on one side of a PE porous membrane.

The samples of Example E-1 and Example F-1 were subjected to a permeation test and a short circuit test. The measurement results are shown in Table 5.

TABLE 5

| | Material | Thickness of Inorganic Particle Membrane [nm] | Density [%] Max-Min | Porosity [%] Max-Min | Permeation Test | Short Circuit Test |
|---|---|---|---|---|---|---|
| Example E-1 | $Al_2O_3$ | 100 | 80-40 | 60-20 | Excellent | Excellent |
| Example F-1 | $Al_2O_3$ | 100 (only on one side) | 80-40 | 60-20 | Excellent | Excellent |

As shown in Table 5, an improvement in performance on short-circuiting was achieved, while maintaining a gas permeability (Gurley number), an index of ion permeation on the outermost-surface side, similar to that of the PE porous membrane of Comparative Example A-1 which has been widely used.

Example G-1

A microporous membrane of Example G-1 was produced in the same manner as in Example A-2, except that a polypropylene porous membrane of similar thickness and porosity to a PE porous membrane was used in place of the PE porous membrane.

Example G-2

A microporous membrane of Example G-2 was produced in the same manner as in Example A-2, except that a polyamide porous membrane of similar thickness and porosity to a PE porous membrane was used in place of the PE porous membrane.

The samples of Example G-1 and Example G-2 were subjected to a permeation test and a short circuit test. The measurement results are shown in Table 6.

TABLE 6

| | Material | Thickness of inorganic particle membrane [nm] | Basic Material | Density [%] Max-Min | Porosity [%] Max-Min | Permeation Test | Short Circuit Test |
|---|---|---|---|---|---|---|---|
| Example G-1 | $Al_2O_3$ | 100 | Polypropylene | 80-40 | 60-20 | Excellent | Excellent |

TABLE 6-continued

|  | Material | Thickness of inorganic particle membrane [nm] | Basic Material | Density [%] Max-Min | Porosity [%] Max-Min | Permeation Test | Short Circuit Test |
|---|---|---|---|---|---|---|---|
| Example G-2 | Al$_2$O$_3$ | 100 | Polyamide | 80-40 | 60-20 | Excellent | Excellent |

As shown in Table 6, also in the case where polypropylene or polyamide was used as a material for the substrate, an improvement in performance on short-circuiting was achieved, while maintaining a gas permeability (Gurley number), an index of ion permeation, similar to that of the PE porous membrane of Comparative Example A-1 which has been widely used.

5. Other Embodiments

Although the second to fourth embodiments have been described with reference to lithium-ion secondary batteries, the invention is also applicable to a nickel hydrogen battery, a nickel cadmium battery, a lithium-manganese dioxide battery, a lithium-iron sulfide battery, and the like, for example.

Also, although the embodiments and examples have been described with reference to so-called lithium-ion secondary batteries in which the capacity of the negative electrode is expressed by a capacity component due to the intercalation and deintercalation of lithium, the embodiments are also applicable to a so-called lithium metal secondary battery in which lithium metal is used for a negative electrode active material, and the capacity of the negative electrode is expressed by a capacity component due to the deposition and dissolution of lithium; and also to a secondary battery in which the charge capacity of a negative electrode material capable of intercalating and deintercalating lithium is made smaller than the charge capacity of the positive electrode, so that the capacity of the negative electrode includes a capacity component due to the intercalation and deintercalation of lithium and a capacity component due to the deposition and dissolution of lithium and is expressed by the sum thereof.

Further, although the above embodiments have been described with reference to nonaqueous electrolyte secondary batteries having a wound structure, the embodiments are also applicable to a battery in which the positive electrode and the negative electrode are folded or stacked, for example. The battery shape is not limited either, and the embodiments are also applicable to a prismatic battery, etc. Further, the embodiments are applicable not only to a secondary battery but also to a primary battery.

For example, the microporous membrane may be used as a separator of an accumulator such as a capacitor.

In addition, for example, the technique to form a shape of inorganic particulates by deposition can be applied to other fields of thin-film devices by selecting substrates and materials from various choices. Thin films obtained by this technique are porous and ensure a specific surface area. Also, by freely controlling the size of deposition particles, functions to allow contact/circulation of air and liquid can be maintained, and the network can be strengthened. Therefore, such thin films can be widely applied to reaction membranes and catalysts with purification/desorption functions, etc.

Specifically, they can be widely applied to photocatalysts with antifouling or super water-repellent properties. In the past, a polymer material has been used for fixing or forming such a functional membrane onto a substrate. Although various efforts have been made, it has been difficult to avoid the degradation of resin by light and a photocatalyst, and there thus is a problem in durability. Also in this application, because the above technique allows the formation in the absence of a polymer, durability-improving effects can be expected. It is also a feature of this technique and the structure that the density and crystalline state of a photocatalyst membrane are varied in the thickness direction, thereby controlling refractive index and wavelength dependence thereof.

Further, a rare metal such as platinum, ruthenium, or palladium may be applied in the form of islands to or supported by the obtained porous membrane, whereby such a membrane can be expected to serve as a catalyst that is effective in small amounts. In the case where the porous membrane is made of a metal oxide, it is also possible to adjust the functions by controlling not only density but also crystallinity and oxidation degree in the thickness direction.

In particular, a transparent electrically conductive film having formed thereon a titanium oxide porous membrane formed by the above technique can be applied to a photoelectric conversion film (anode film) and a dye-sensitized solar cell using the same. By adjusting void size and strength by the above technique, it is possible to design a photoelectric conversion film having a large specific surface area and thus including many dye adsorption sites, in which, considering the molecular size and viscosity of the electrolyte, the network of titanium oxide is firm, suppressing a degradation of electrical conductivity.

As methods for forming an anode film, a sol-gel method and an application method using titanium oxide particulates, an organic substance or a polymer resin, and an organic solvent have been widely known. However, after the application, it is necessary to perform a high-temperature treatment for the removal of polymer or a firing treatment at a high temperature of about 400° C. for the formation of a network of titanium oxide particulates. For this reason, it is difficult to form a titanium oxide porous membrane on an ordinary polymer substrate, and the substrate has been limited to a heat-resistant material, such as glass.

In contrast, the above technique employs deposition. Accordingly, the substrate bulk temperature does not rise much, and this allows use of a wide variety of ordinary transparent polymer material substrates, making it possible to employ roll-to-roll production to provide products at low cost. Further, by forming a high-density titanium oxide membrane on the side closer to the substrate (electrically conductive membrane), while forming a low-density titanium oxide membrane on the side closer to the deposition surface (the electrolyte contact side, closer to the cathode) sequentially or in a multi-stage manner, a short circuit (reverse reaction) on the electrode surface can be suppressed, and it is also possible to design a membrane that does not interfere with the movement of an electrolyte or the transfer of electrons, thereby maximizing the light efficiency. Accordingly, a highly efficient dye-sensitized solar cell can be obtained.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A method for producing a separator, the method comprising:
providing a particle membrane including inorganic particles on at least one principal surface of a porous body by a vapor-phase deposition process, wherein an incidence angle of the vapor-phase deposition process is varied within 0° to 45° such that the particle membrane has a porosity that is non-uniform in a thickness direction thereof, wherein the particle membrane has a thickness of 10 nm or more and less than 100 nm, wherein at least 50% of the inorganic particles have a secondary particle diameter of 20 nm or less, wherein the particle membrane has an oxidation degree that is non-uniform in a thickness direction thereof, the oxidation degree operably controllable by supplying oxygen gas to the principal surface of the porous body during vapor deposition of the particle membrane, and wherein the oxidation degree is highest near an outer surface of the particle membrane and lowest near an interface between the article membrane and the porous body.

2. The method according to claim 1, wherein the vapor-phase deposition process is selected from the group consisting of a physical vapor deposition process and a chemical vapor deposition process.

3. The method according to claim 2, wherein the physical vapor deposition process is selected from the group consisting of vacuum deposition, sputtering, ion plating, molecular beam epitaxy, and laser ablation.

4. The method according to claim 2, wherein the chemical vapor deposition process is selected from the group consisting of metal organic chemical vapor deposition, radio-frequency plasma chemical vapor deposition, optical chemical vapor deposition, laser chemical vapor deposition, and liquid phase epitaxy.

5. The method according to claim 1, wherein a minimum value of the porosity is about 50% or less.

6. The method according to claim 1, wherein a minimum value of the porosity is about 40% or less.

7. The method according to claim 1, wherein the porosity, in the thickness direction of the particle membrane, is highest near an interface between the particle membrane and the porous body.

8. The method according to claim 1, wherein the porosity, in the thickness direction of the particle membrane, is lowest near an outer surface of the particle membrane.

9. The method according to claim 1, wherein the porosity, in the thickness direction of the particle membrane, decreases from an interface between the particle membrane and the porous body to an outer surface of the particle membrane.

10. The method according to claim 1, wherein a density of the inorganic particles, in the thickness direction of the particle membrane, decreases from an outer surface of the particle membrane to an interface between the particle membrane and the porous body.

11. A method for producing a microporous membrane, the method comprising:
providing inorganic particles on at least one principal surface of a porous body by a vapor-phase deposition process, wherein an incidence angle of the vapor-phase deposition process is varied within 0° to 45° such that the microporous membrane has a porosity that is non-uniform in a thickness direction thereof, wherein the microporous membrane has a thickness of 10 nm or more and less than 100 nm, wherein at least 50% of the inorganic particles have a secondary particle diameter of 20 nm or less, wherein the microporous membrane has an oxidation degree that is non-uniform in a thickness direction thereof, the oxidation degree operably controllable by supplying oxygen gas to the principal surface of the porous body during vapor deposition of the microporous membrane, and wherein the oxidation degree is highest near an outer surface of the microporous membrane and lowest near an interface between the microporous membrane and the porous body.

12. The method according to claim 11, wherein the vapor-phase deposition process is selected from the group consisting of a physical vapor deposition process and a chemical vapor deposition process.

13. The method according to claim 12, wherein the physical vapor deposition process is selected from the group consisting of vacuum deposition, sputtering, ion plating, molecular beam epitaxy, and laser ablation.

14. The method according to claim 12, wherein the chemical vapor deposition process is selected from the group consisting of metal organic chemical vapor deposition, radio-frequency plasma chemical vapor deposition, optical chemical vapor deposition, laser chemical vapor deposition, and liquid phase epitaxy.

15. The method according to claim 11, wherein a minimum value of the porosity is about 50% or less.

16. The method according to claim 11, wherein a minimum value of the porosity is about 40% or less.

17. The method according to claim 11, wherein the porosity, in the thickness direction of the microporous membrane, is highest near an interface between the inorganic particles and the porous body.

18. The method according to claim 11, wherein the porosity, in the thickness direction of the microporous membrane, is lowest near an outer surface of the microporous membrane.

19. The method according to claim 11, wherein the porosity, in the thickness direction of the microporous membrane, decreases from an interface between the inorganic particles and the porous body to an outer surface of the microporous membrane.

20. The method according to claim 11, wherein a density of the inorganic particles, in the thickness direction of the microporous membrane, decreases from an outer surface of the microporous membrane to an interface between the inorganic particles and the porous body.

* * * * *